United States Patent
Khlat et al.

(10) Patent No.: US 11,025,224 B2
(45) Date of Patent: *Jun. 1, 2021

(54) RF CIRCUITRY HAVING SIMPLIFIED ACOUSTIC RF RESONATOR PARALLEL CAPACITANCE COMPENSATION

(71) Applicant: Qorvo US, Inc., Greensboro, NC (US)

(72) Inventors: Nadim Khlat, Cugnaux (FR); Jean-Frederic Chiron, Tournefeuille (FR); Marcus Granger-Jones, Scotts Valley, CA (US); Andrew F. Folkmann, Cedar Rapids, IA (US); Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 173 days.

This patent is subject to a terminal disclaimer.

(21) Appl. No.: 16/283,044

(22) Filed: Feb. 22, 2019

(65) Prior Publication Data
US 2019/0214966 A1 Jul. 11, 2019

Related U.S. Application Data

(63) Continuation of application No. 14/757,651, filed on Dec. 23, 2015, now Pat. No. 10,333,494.

(Continued)

(51) Int. Cl.
*H03H 9/54* (2006.01)
*H03H 9/56* (2006.01)
(Continued)

(52) U.S. Cl.
CPC .............. *H03H 9/542* (2013.01); *H01Q 1/50* (2013.01); *H03H 9/568* (2013.01); *H03H 9/605* (2013.01);
(Continued)

(58) Field of Classification Search
CPC ........ H03H 9/542; H03H 9/568; H03H 9/605; H03H 9/64; H03H 9/6483; H04B 1/04; H04B 1/10; H04B 1/16; H01Q 1/50
(Continued)

(56) References Cited

U.S. PATENT DOCUMENTS 3,731,230 A 5/1973 Cerny, Jr.
3,875,533 A 4/1975 Irwin et al.
(Continued)

FOREIGN PATENT DOCUMENTS

JP  2012257050 A  12/2012

OTHER PUBLICATIONS

Notice of Allowance for U.S. Appl. No. 15/586,374, dated Oct. 4, 2019, 7 pages.

(Continued)

*Primary Examiner* — Barbara Summons
(74) *Attorney, Agent, or Firm* — Withrow & Terranova, P.L.L.C.

(57) ABSTRACT

RF circuitry, which includes a first acoustic RF resonator (ARFR) and a first compensating ARFR, is disclosed. A first inductive element is coupled between the first compensating ARFR and a first end of the first ARFR. A second inductive element is coupled between the first compensating ARFR and a second end of the first ARFR. The first compensating ARFR, the first inductive element, and the second inductive element at least partially compensate for a parallel capacitance of the first ARFR.

20 Claims, 21 Drawing Sheets

Related U.S. Application Data

(60) Provisional application No. 62/096,801, filed on Dec. 24, 2014, provisional application No. 62/109,693, filed on Jan. 30, 2015.

(51) Int. Cl.
    *H03H 9/60* (2006.01)
    *H03H 9/64* (2006.01)
    *H04B 1/10* (2006.01)
    *H01Q 1/50* (2006.01)
    *H04B 1/04* (2006.01)
    *H04B 1/16* (2006.01)

(52) U.S. Cl.
    CPC ............ *H03H 9/64* (2013.01); *H03H 9/6483* (2013.01); *H04B 1/04* (2013.01); *H04B 1/10* (2013.01); *H04B 1/16* (2013.01)

(58) Field of Classification Search
    USPC .................................. 333/133, 193, 195, 189
    See application file for complete search history.

(56) References Cited

U.S. PATENT DOCUMENTS

| | | | |
|---|---|---|---|
| 4,442,434 A | 4/1984 | Baekgaard | |
| 4,577,168 A | 3/1986 | Hartmann | |
| 5,291,159 A | 3/1994 | Vale | |
| 6,067,391 A | 5/2000 | Land | |
| 6,670,866 B2 | 12/2003 | Ella et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson, III et al. | |
| 6,975,183 B2 | 12/2005 | Aigner et al. | |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2 | 6/2008 | Larson, III et al. | |
| 7,436,269 B2 | 10/2008 | Wang et al. | |
| 7,515,018 B2 | 4/2009 | Handtmann et al. | |
| 7,804,374 B1 | 9/2010 | Brown et al. | |
| 7,825,749 B2 | 11/2010 | Thalhammer et al. | |
| 7,855,618 B2 | 12/2010 | Frank et al. | |
| 7,889,024 B2 | 2/2011 | Bradley et al. | |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,248,185 B2 | 8/2012 | Choy et al. | |
| 8,508,315 B2 | 8/2013 | Jamneala et al. | |
| 8,575,820 B2 | 11/2013 | Shirakawa et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,243,316 B2 | 1/2016 | Larson, III et al. | |
| 9,484,883 B2 | 11/2016 | Nishizawa et al. | |
| 9,698,756 B2 | 7/2017 | Khlat et al. | |
| 9,837,984 B2 | 12/2017 | Khlat et al. | |
| 9,847,769 B2 | 12/2017 | Khlat et al. | |
| 9,887,686 B2 | 2/2018 | Kuwahara | |
| 9,929,716 B2 | 3/2018 | Lee et al. | |
| 10,009,001 B2 | 6/2018 | Jiang et al. | |
| 10,141,644 B2 | 11/2018 | Khlat et al. | |
| 10,333,494 B2 * | 6/2019 | Khlat ...................... | H04B 1/04 |
| 2002/0109564 A1 | 8/2002 | Tsai et al. | |
| 2004/0100342 A1 * | 5/2004 | Nishihara .............. | H03H 9/568 |
| | | | 333/133 |
| 2005/0057117 A1 | 3/2005 | Nakatsuka et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2008/0169884 A1 | 7/2008 | Matsumoto et al. | |
| 2008/0297278 A1 | 12/2008 | Handtmann et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0121689 A1 | 5/2011 | Grannen et al. | |
| 2011/0204995 A1 | 8/2011 | Jamneala et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0113576 A1 | 5/2013 | Inoue et al. | |
| 2013/0193808 A1 | 8/2013 | Feng et al. | |
| 2014/0132117 A1 | 5/2014 | Larson, III | |
| 2014/0145557 A1 | 5/2014 | Tanaka | |
| 2014/0167565 A1 | 6/2014 | Iwamoto | |
| 2015/0222246 A1 | 8/2015 | Nosaka | |
| 2015/0280100 A1 | 10/2015 | Burak et al. | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2018/0358947 A1 | 12/2018 | Mateu et al. | |
| 2019/0103851 A1 | 4/2019 | Yusuf | |
| 2019/0140618 A1 | 5/2019 | Takamine | |
| 2019/0181835 A1 | 6/2019 | Timme et al. | |
| 2019/0199320 A1 | 6/2019 | Morita et al. | |
| 2019/0207583 A1 | 7/2019 | Miura et al. | |
| 2019/0222197 A1 | 7/2019 | Khlat et al. | |
| 2019/0288664 A1 | 9/2019 | Saji | |
| 2019/0305752 A1 | 10/2019 | Sadhu et al. | |

OTHER PUBLICATIONS

Notice of Allowance for U.S. Appl. No. 15/644,922, dated Oct. 21, 2019, 10 pages.

Non-Final Office Action for U.S. Appl. No. 15/883,933, dated Oct. 25, 2019, 19 pages.

Final Office Action for U.S. Appl. No. 15/697,658, dated Oct. 22, 2019, 9 pages.

Larson, John, et al., "Characterization of Reversed c-axis AlN Thin Films," International Ultrasonics Symposium Proceedings, 2010, IEEE, pp. 1054-1059.

Capilla, Jose et al., "High-Acoustic-Impedance Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.

Fattinger, Gernot et al., "'Single-to-balanced Filters for Mobile Phones using Coupled Resonator BAW Technology,'" 2004 IEEE

(56) References Cited

OTHER PUBLICATIONS

International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/003,417, dated Apr. 3, 2020, 9 pages.
Non-Final Office Action for U.S. Appl. No. 16/290,175, dated Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Final Office Action for U.S. Appl. No. 15/883,933, dated Oct. 23, 2020, 15 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AIN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Pads, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Notice of Allowance for U.S. Appl. No. 15/697,658, dated Nov. 17, 2020, 7 pages.
Advisory Action for U.S. Appl. No. 15/883,933, dated Dec. 31, 2020, 3 pages.
Non-Final Office Action for U.S. Appl. No. 16/290,175, dated Jan. 6, 2021, 14 pages.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Non-Final Office Action for U.S. Appl. No. 16/740,667, dated Mar. 4, 2021, 10 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.

* cited by examiner

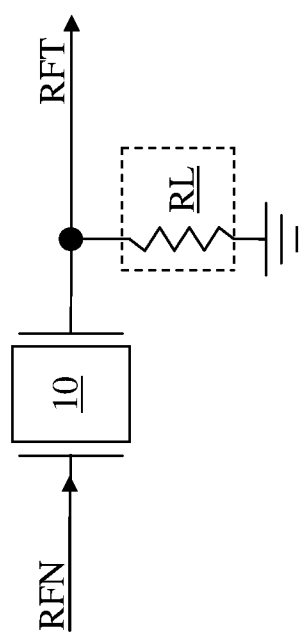
FIG. 1A – PRIOR ART
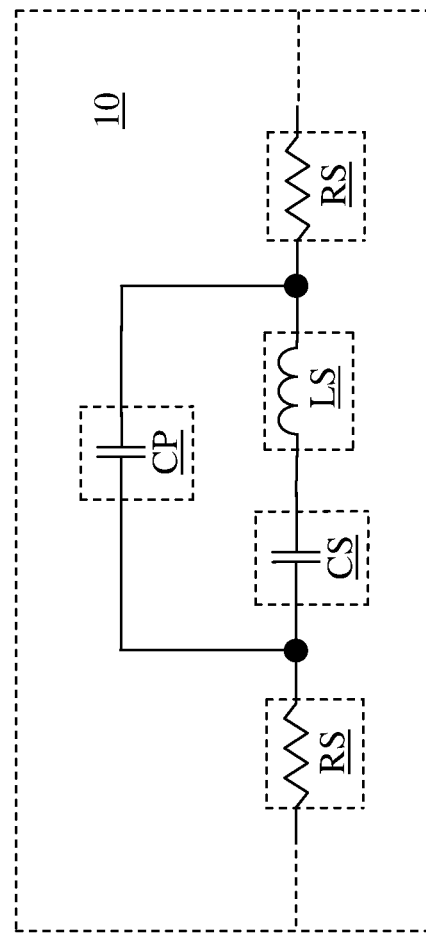
FIG. 1B – PRIOR ART

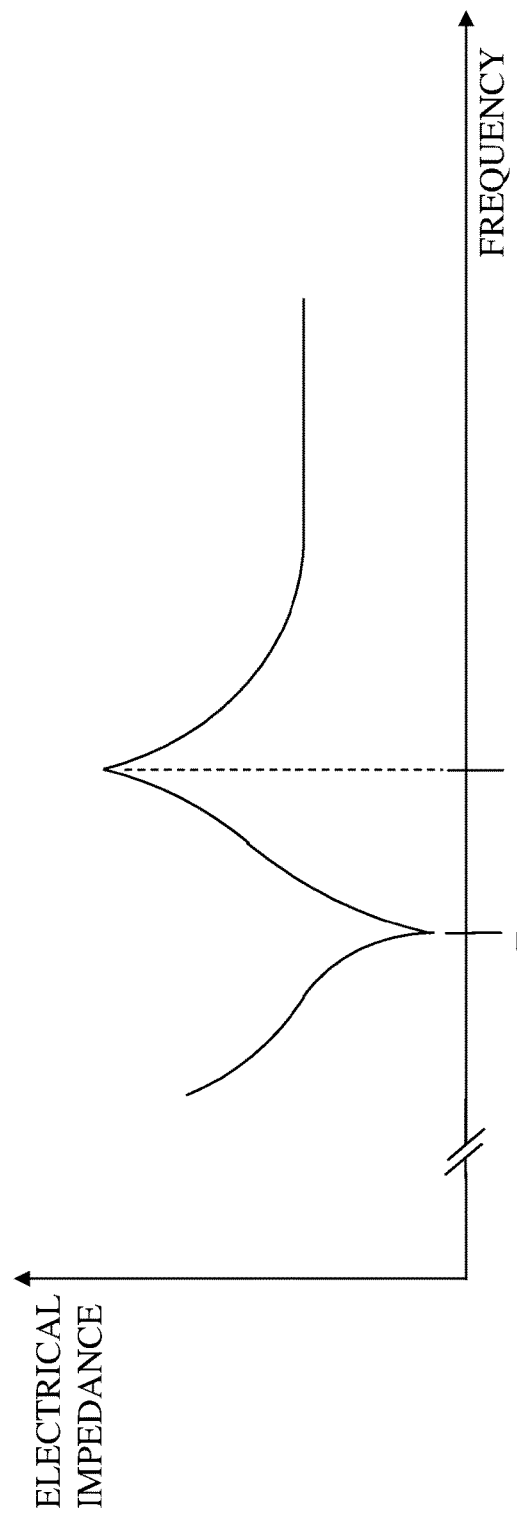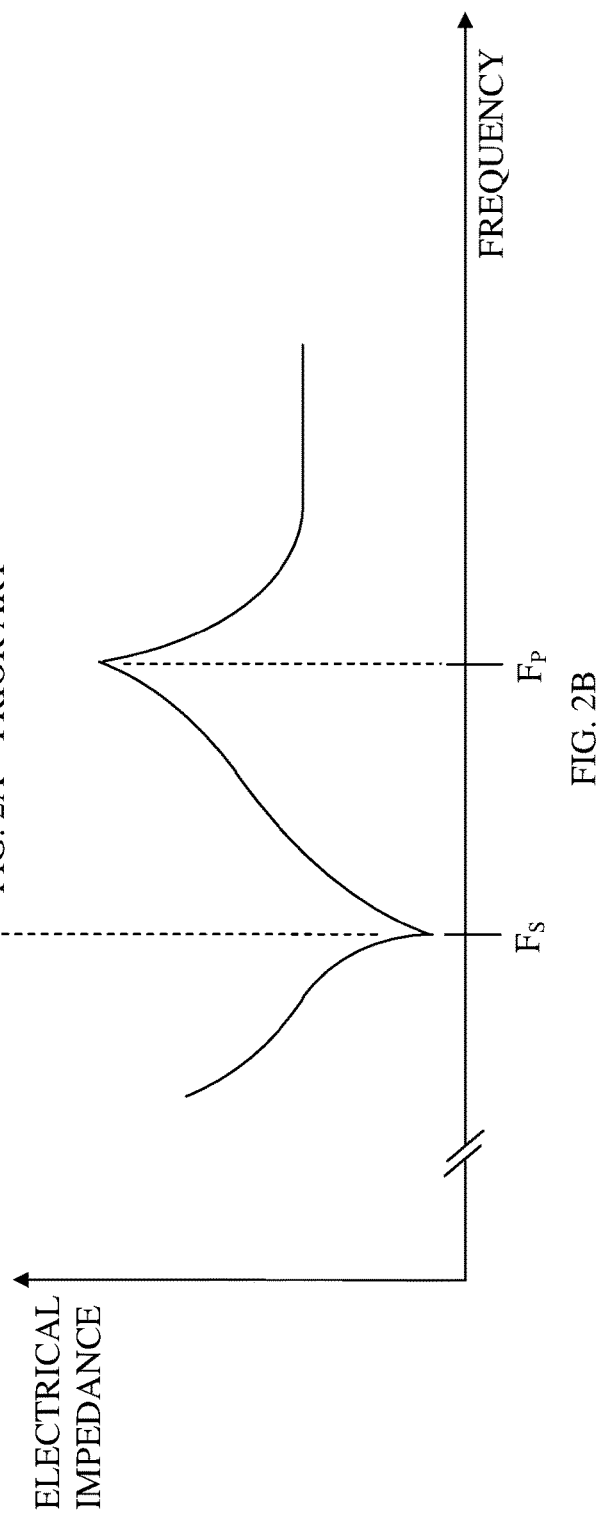

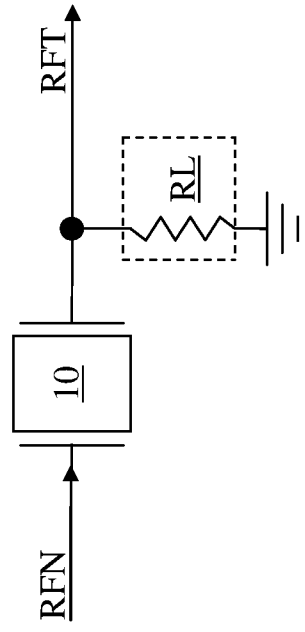
FIG. 11A – PRIOR ART
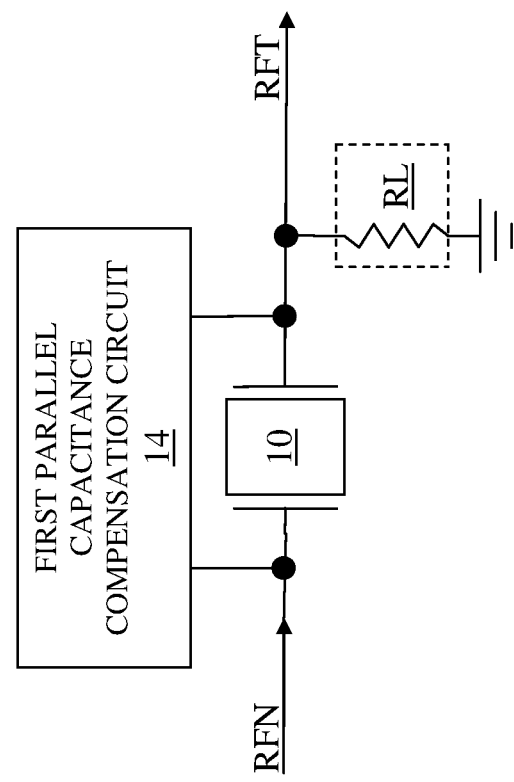
FIG. 11B

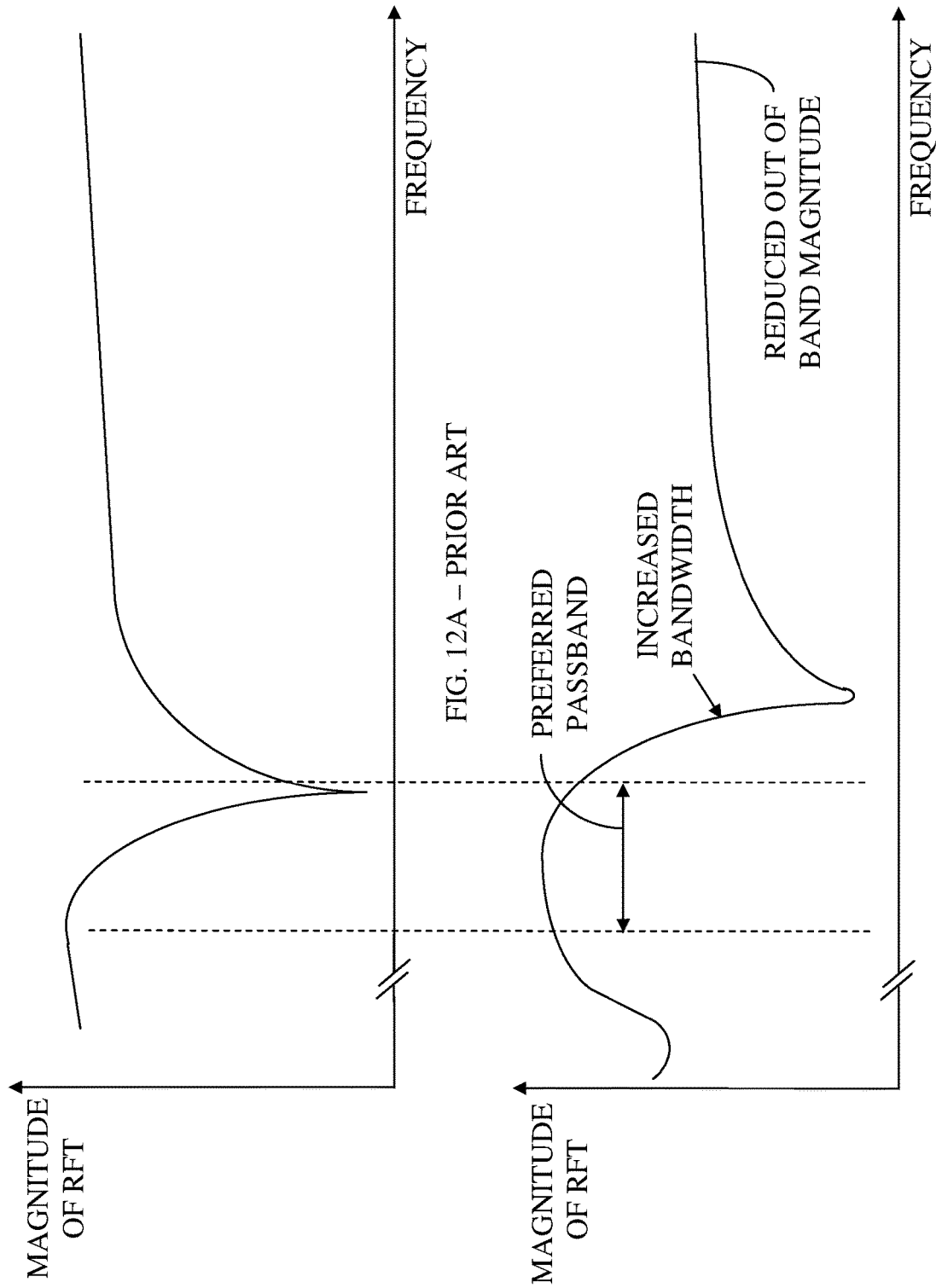

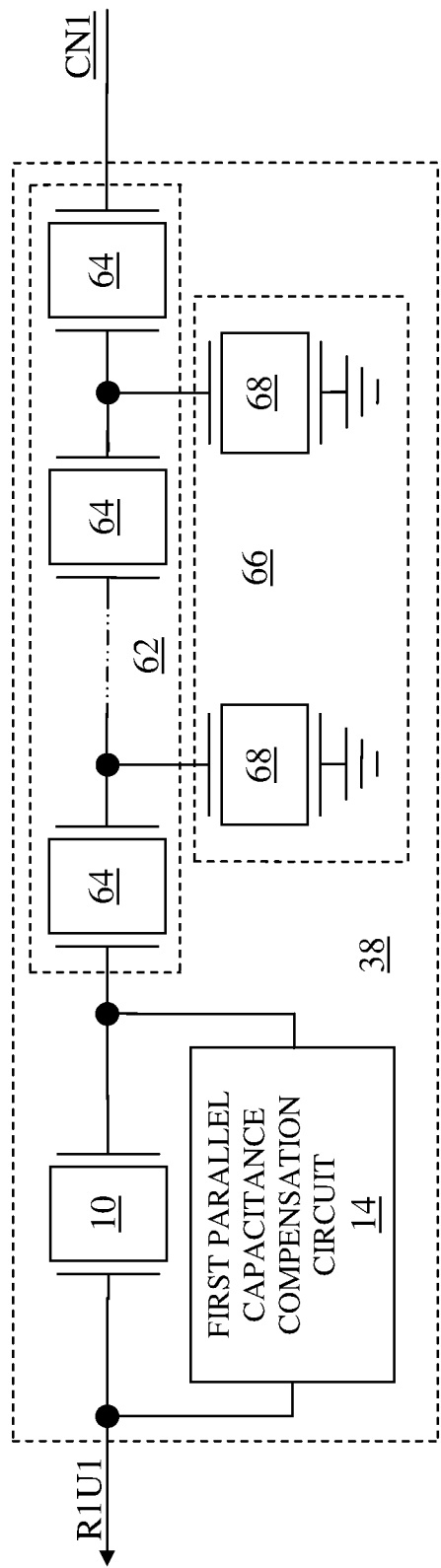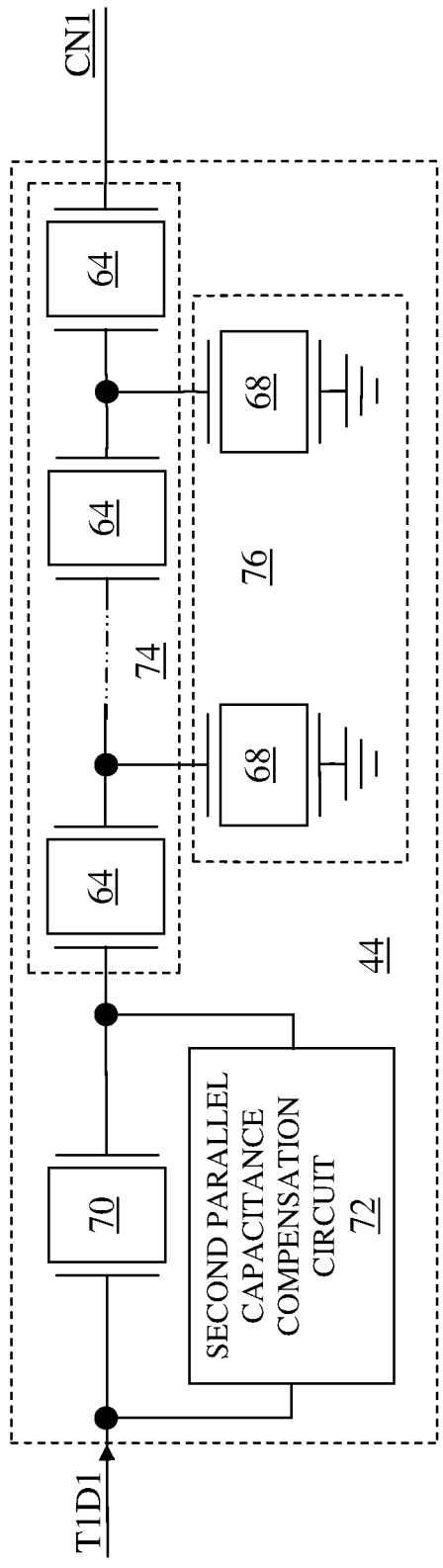

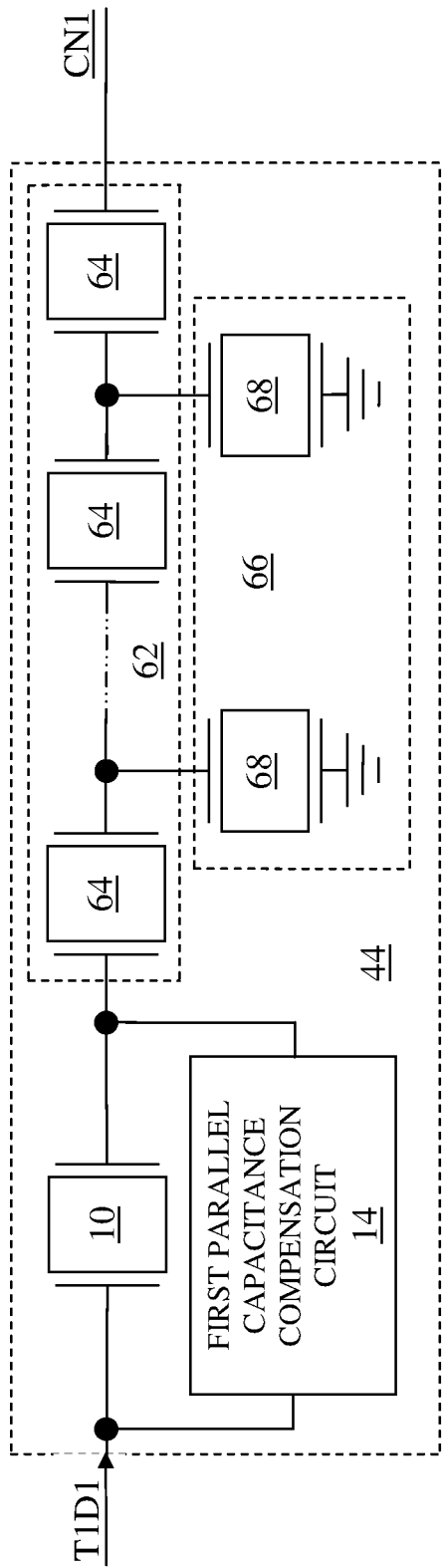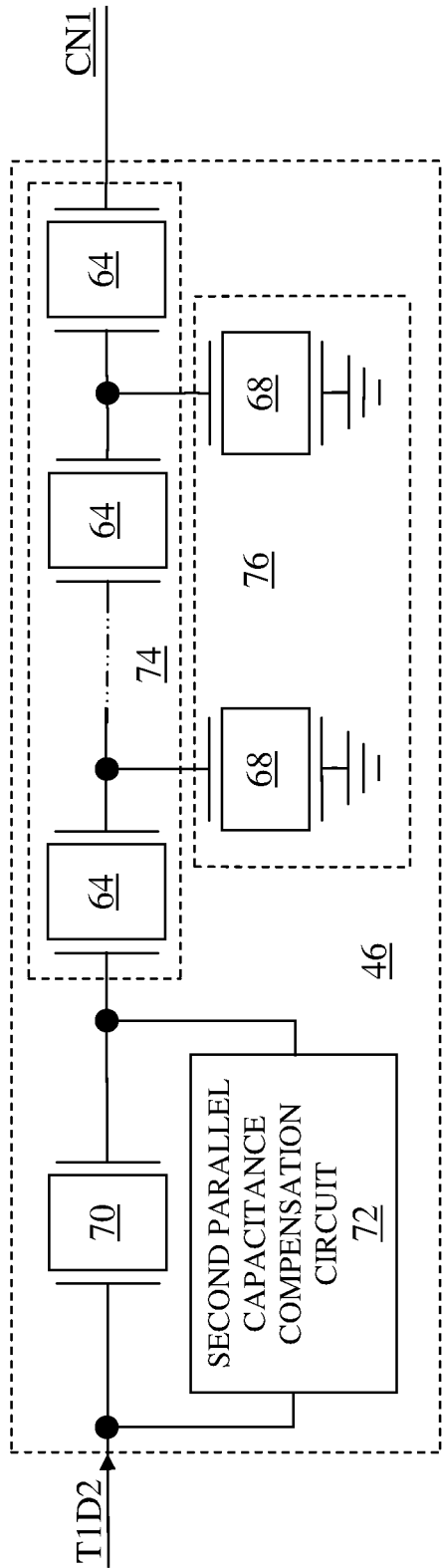

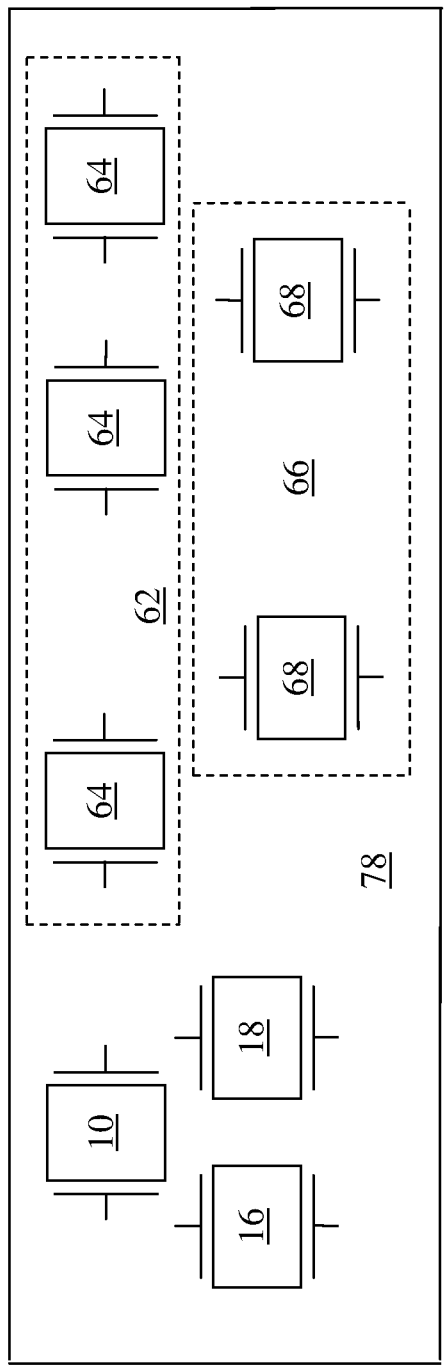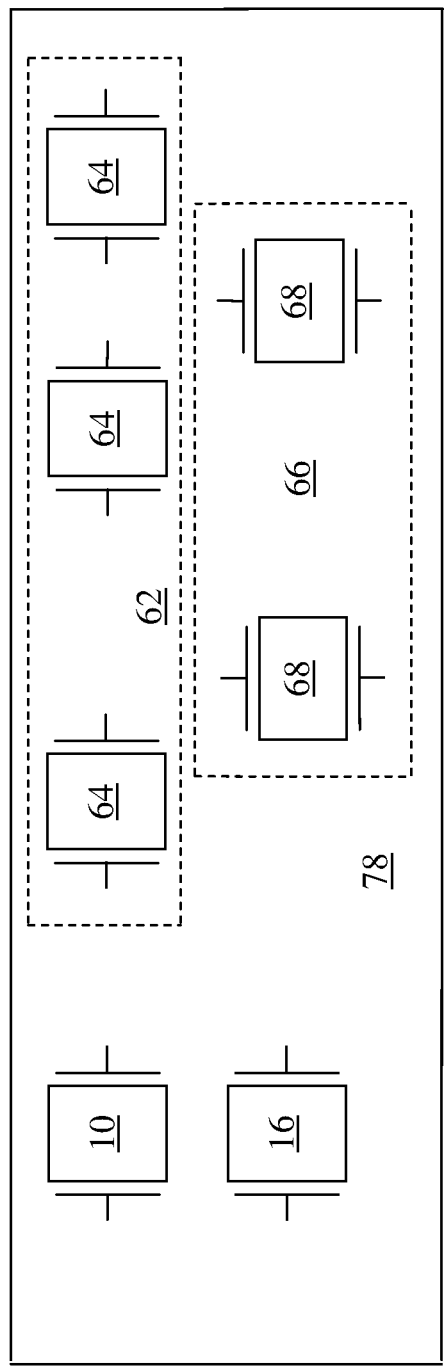

RF CIRCUITRY HAVING SIMPLIFIED ACOUSTIC RF RESONATOR PARALLEL CAPACITANCE COMPENSATION

RELATED APPLICATIONS

The present application is a continuation of U.S. patent application Ser. No. 14/757,651, filed Dec. 23, 2015, now U.S. Pat. No. 10,333,494, which claims the benefits of U.S. provisional patent application No. 62/096,801, filed Dec. 24, 2014, and U.S. provisional patent application No. 62/109,693, filed Jan. 30, 2015.

All of the applications listed above are hereby incorporated herein by reference in their entireties.

FIELD OF THE DISCLOSURE

Embodiments of the present disclosure relate to radio frequency (RF) communications systems, which may include RF front-end circuitry, RF transceiver circuitry, RF transmit circuitry, RF receive circuitry, RF diplexers, RF duplexers, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, high performance, and efficient as is practical. Thus, there is a need for RF circuitry in a communications device that is low cost, small, simple, flexible, high performance, and efficient.

SUMMARY

RF circuitry, which includes a first acoustic RF resonator (ARFR) and a first compensating ARFR, is disclosed. A first inductive element is coupled between the first compensating ARFR and a first end of the first ARFR. A second inductive element is coupled between the first compensating ARFR and a second end of the first ARFR. The first compensating ARFR, the first inductive element, and the second inductive element at least partially compensate for a parallel capacitance of the first ARFR.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1A shows a first acoustic RF resonator (ARFR) and a load resistive element according to the prior art.

FIG. 1B illustrates a simplified behavioral model of the first ARFR illustrated in FIG. 1 according to the prior art.

FIG. 2A is a graph illustrating an electrical impedance of the first ARFR over an operating frequency ranges of the first ARFR according to the prior art.

FIG. 2B is a graph illustrating a preferred electrical impedance of the first ARFR over the operating frequency ranges of the first ARFR according to one embodiment of the present disclosure.

FIG. 11A shows the first ARFR and the load resistive element according to the prior art.

FIG. 11B shows the first ARFR, the load resistive element, and a first parallel capacitance compensation circuit according to one embodiment of the first ARFR, the load resistive element, and the first parallel capacitance compensation circuit.

FIG. 12A is a graph illustrating a magnitude of an RF output signal illustrated in FIG. 11A according to the prior art.

FIG. 12B is a graph illustrating a magnitude of the RF output signal illustrated in FIG. 11B according to one embodiment of the first ARFR, the load resistive element, and the first parallel capacitance compensation circuit.

FIG. 18A shows details of the first antenna, first RF RX bandpass filter illustrated in FIG. 15 according to one embodiment of the first antenna, first RF RX bandpass filter.

FIG. 18B shows details of the first antenna, second RF RX bandpass filter illustrated in FIG. 15 according to one embodiment of the first antenna, first RF TX bandpass filter.

FIG. 20A shows details of the first antenna, first RF TX bandpass filter illustrated in FIG. 15 according to one embodiment of the first antenna, first RF TX bandpass filter.

FIG. 20B shows details of the first antenna, second RF TX bandpass filter illustrated in FIG. 15 according to one embodiment of the first antenna, second RF TX bandpass filter.

FIG. 21A shows a portion of the RF circuitry according to one embodiment of the RF circuitry.

FIG. 21B shows a portion of the RF circuitry according to one embodiment of the RF circuitry.

DETAILED DESCRIPTION

Figure 3:
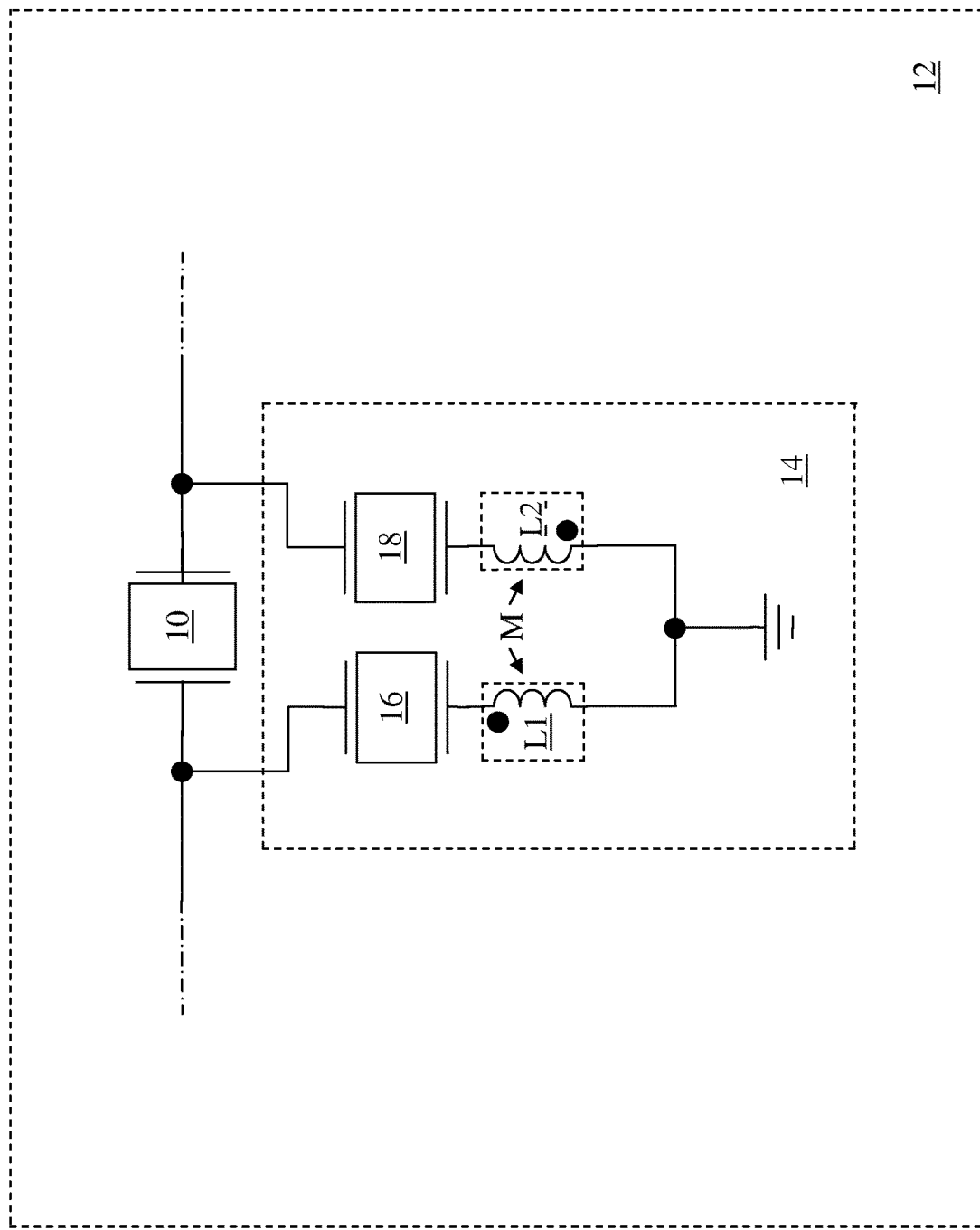
FIG. 3 shows RF circuitry according to one embodiment of the RF circuitry.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

RF circuitry, which includes a first acoustic RF resonator (ARFR), a first compensating ARFR, and a second compensating ARFR, is disclosed according to one embodiment of the present disclosure. The first compensating ARFR is coupled between a first inductive element and a first end of the first ARFR. The second compensating ARFR is coupled between a second inductive element and a second end of the first ARFR. The first inductive element and the second inductive element are negatively coupled to one another. The first compensating ARFR, the second compensating ARFR, the first inductive element, and the second inductive element at least partially compensate for a parallel capacitance of the first ARFR.

RF circuitry, which includes the first ARFR and the first compensating ARFR, is disclosed according to an alternate embodiment of the present disclosure. The first inductive element is coupled between the first compensating ARFR and a first end of the first ARFR. The second inductive element is coupled between the first compensating ARFR and a second end of the first ARFR. The first compensating ARFR, the first inductive element, and the second inductive element at least partially compensate for the parallel capacitance of the first ARFR. In one embodiment of the first inductive element and the second inductive element, the first inductive element and the second inductive element are negatively coupled to one another.

FIG. 1A shows a first ARFR 10 and a load resistive element RL according to the prior art. The first ARFR 10 and the load resistive element RL are coupled in series to ground to form an RF filter, which has RF bandpass filtering characteristics. The first ARFR 10 receives an RF input signal RFN and a connection between the first ARFR 10 and the load resistive element RL provides an RF output signal RFT.

FIG. 1B illustrates a simplified behavioral model of the first ARFR 10 illustrated in FIG. 1 according to the prior art. According to the simplified behavioral model, the first ARFR 10 has a series resistance RS, a series inductance LS, and a series capacitance CS coupled in series with one another. Additionally, the first ARFR 10 has a parallel capacitance CP coupled in parallel with a series combination of the series capacitance CS and the series inductance LS. As a result, the first ARFR 10 has a series resonant frequency $F_S$ (FIG. 2A) and a parallel resonant frequency $F_P$ (FIG. 2A).

FIG. 2A is a graph illustrating an electrical impedance of the first ARFR 10 (FIG. 1A) over an operating frequency range of the first ARFR 10 (FIG. 1A) according to the prior art. When using the first ARFR 10 (FIG. 1A) as a series element in an RF bandpass filter, preferably the series resonant frequency $F_S$ falls within a passband of the RF bandpass filter and the parallel resonant frequency $F_P$ falls outside of the passband of the RF bandpass filter. However, if the parallel capacitance CP (FIG. 1B) of the first ARFR 10 is large, then a bandwidth of the RF bandpass filter may be too narrow to meet design requirements. Additionally, since the parallel capacitance CP (FIG. 1B) appears primarily across the first ARFR 10 (FIG. 1A), as frequency increases, impedance of the parallel capacitance CP (FIG. 1B) drops, thereby degrading RF bandpass filtering performance at higher frequencies. Reducing the parallel capacitance CP (FIG. 1B) drives the parallel resonant frequency $F_P$ to higher values. However, the power handling capabilities of the first ARFR 10 (FIG. 1A) may be reduced below requirements. Thus, there is a need to reduce the effects of the parallel resonant frequency $F_P$, particularly in RF bandpass filtering applications.

One metric for quantifying bandpass filter effectiveness of the first ARFR 10 (FIG. 1A) is an RF coupling factor (k2e), which is defined as shown in EQ. 1 below.

$$k2e=[(\pi/2)*(F_S/F_P)]/[\tan((\pi/2)*(F_S/F_P))]. \quad \text{EQ. 1:}$$

As the parallel resonant frequency $F_P$ increases relative to the series resonant frequency $F_S$, k2e increases, thereby improving the bandpass filter effectiveness of the first ARFR 10 (FIG. 1A). One way to increase the parallel resonant frequency $F_P$ of the first ARFR 10 (FIG. 1A) is decrease a net parallel capacitance CP (FIG. 1A) of the first ARFR 10 (FIG. 1A).

FIG. 2B is a graph illustrating a preferred electrical impedance of the first ARFR 10 (FIG. 1A) over the operating frequency ranges of the first ARFR 10 (FIG. 1A) according to one embodiment of the present disclosure. As such, a first parallel capacitance compensation circuit 12 (FIG. 3) is coupled across the first ARFR 10 (FIG. 1A) to at least partially compensate for the parallel capacitance CP (FIG. 1B) of the first ARFR 10 (FIG. 1A), thereby increasing the parallel resonant frequency $F_P$ and increasing k2e.

FIG. 3 shows RF circuitry 12 according to one embodiment of the RF circuitry 12. The RF circuitry 12 illustrated in FIG. 3 includes the first ARFR 10 and a first parallel capacitance compensation circuit 14, which includes a first compensating ARFR 16, a second compensating ARFR 18, a first inductive element L1, and a second inductive element L2.

The first compensating ARFR 16 is coupled between the first inductive element L1 and a first end of the first ARFR 10. The second compensating ARFR 18 is coupled between the second inductive element L2 and a second end of the first ARFR 10. The first inductive element L1 and the second inductive element L2 have mutual coupling M between them as illustrated in FIG. 3. Further, the first inductive element L1 and the second inductive element L2 are negatively coupled to one another as illustrated in FIG. 3. The first compensating ARFR 16, the second compensating ARFR 18, the first inductive element L1, and the second inductive element L2 at least partially compensate for the parallel capacitance CP (FIG. 1B) of the first ARFR 10. In general, in one embodiment of the RF circuitry 12, the first parallel capacitance compensation circuit 14 at least partially compensate for the parallel capacitance CP (FIG. 1B) of the first ARFR 10.

The first inductive element L1 is coupled between the first compensating ARFR 16 and ground. The second inductive element L2 is coupled between the second compensating ARFR 18 and the ground. In general, in one embodiment of the first parallel capacitance compensation circuit 14, the first parallel capacitance compensation circuit 14 is a passive circuit, which includes no active components.

In one embodiment of the first inductive element L1 and the second inductive element L2, an absolute value of a coefficient of coupling between the first inductive element L1 and the second inductive element L2 is greater than zero. In an alternate embodiment of the first inductive element L1 and the second inductive element L2, the absolute value of the coefficient of coupling between the first inductive element L1 and the second inductive element L2 is greater than 0.1. In an additional embodiment of the first inductive element L1 and the second inductive element L2, the absolute value of the coefficient of coupling between the first inductive element L1 and the second inductive element L2 is greater than 0.2.

In one embodiment of the first inductive element L1 and the second inductive element L2, the absolute value of the coefficient of coupling between the first inductive element L1 and the second inductive element L2 is less than 0.7. In an alternate embodiment of the first inductive element L1 and the second inductive element L2, the absolute value of the coefficient of coupling between the first inductive element L1 and the second inductive element L2 is less than 0.6. In an additional embodiment of the first inductive element L1 and the second inductive element L2, the absolute value of the coefficient of coupling between the first inductive element L1 and the second inductive element L2 is less than 0.5. In another embodiment of the first inductive element L1 and the second inductive element L2, the absolute value of the coefficient of coupling between the first inductive element L1 and the second inductive element L2 is less than 0.4. In a further embodiment of the first inductive element L1 and the second inductive element L2, the absolute value of the coefficient of coupling between the first inductive element L1 and the second inductive element L2 is less than 0.3.

In one embodiment of the first inductive element L1 and the second inductive element L2, an inductance of the first inductive element L1 is essentially equal to an inductance of the second inductive element L2. In an alternate embodiment of the first inductive element L1 and the second inductive element L2, the inductance of the first inductive element L1 is not equal to the inductance of the second inductive element L2.

In one embodiment of the first parallel capacitance compensation circuit 14, the first parallel capacitance compensation circuit 14 augments RF bandpass filtering behavior of the first ARFR 10. In one embodiment of the first parallel capacitance compensation circuit 14, the first parallel capacitance compensation circuit 14 increases a ratio of the parallel resonant frequency $F_P$ (FIG. 2B) to the series resonant frequency $F_S$ (FIG. 2B).

In one embodiment of the first parallel capacitance compensation circuit 14 and the first ARFR 10, the first parallel capacitance compensation circuit 14 and the first ARFR 10 function as an RF bandpass filtering element, such that the parallel resonant frequency $F_P$ (FIG. 2B) falls outside of a passband of the RF bandpass filtering element.

In one embodiment of the first parallel capacitance compensation circuit 14 and the first ARFR 10, the first parallel capacitance compensation circuit 14 is coupled across the first ARFR 10, such that the first parallel capacitance compensation circuit 14 presents a positive reactance across the first ARFR 10. A magnitude of the positive reactance is inversely related to frequency. Since the parallel capacitance CP (FIG. 1B) of the first ARFR 10 presents a negative reactance across the first ARFR 10, such that the negative reactance is inversely related to frequency, the positive reactance at least partially cancels the negative reactance, thereby at least partially compensating for the parallel capacitance CP (FIG. 1B) of the first ARFR 10.

In one embodiment of the first ARFR 10, the first compensating ARFR 16, and the second compensating ARFR 18, each of the first ARFR 10, the first compensating ARFR 16, and the second compensating ARFR 18 is a surface acoustic wave (SAW) RF resonator. In an alternate embodiment of the first ARFR 10, the first compensating ARFR 16, and the second compensating ARFR 18, each of the first ARFR 10, the first compensating ARFR 16, and the second compensating ARFR 18 is a bulk acoustic wave (BAW) RF resonator.

Figure 4:
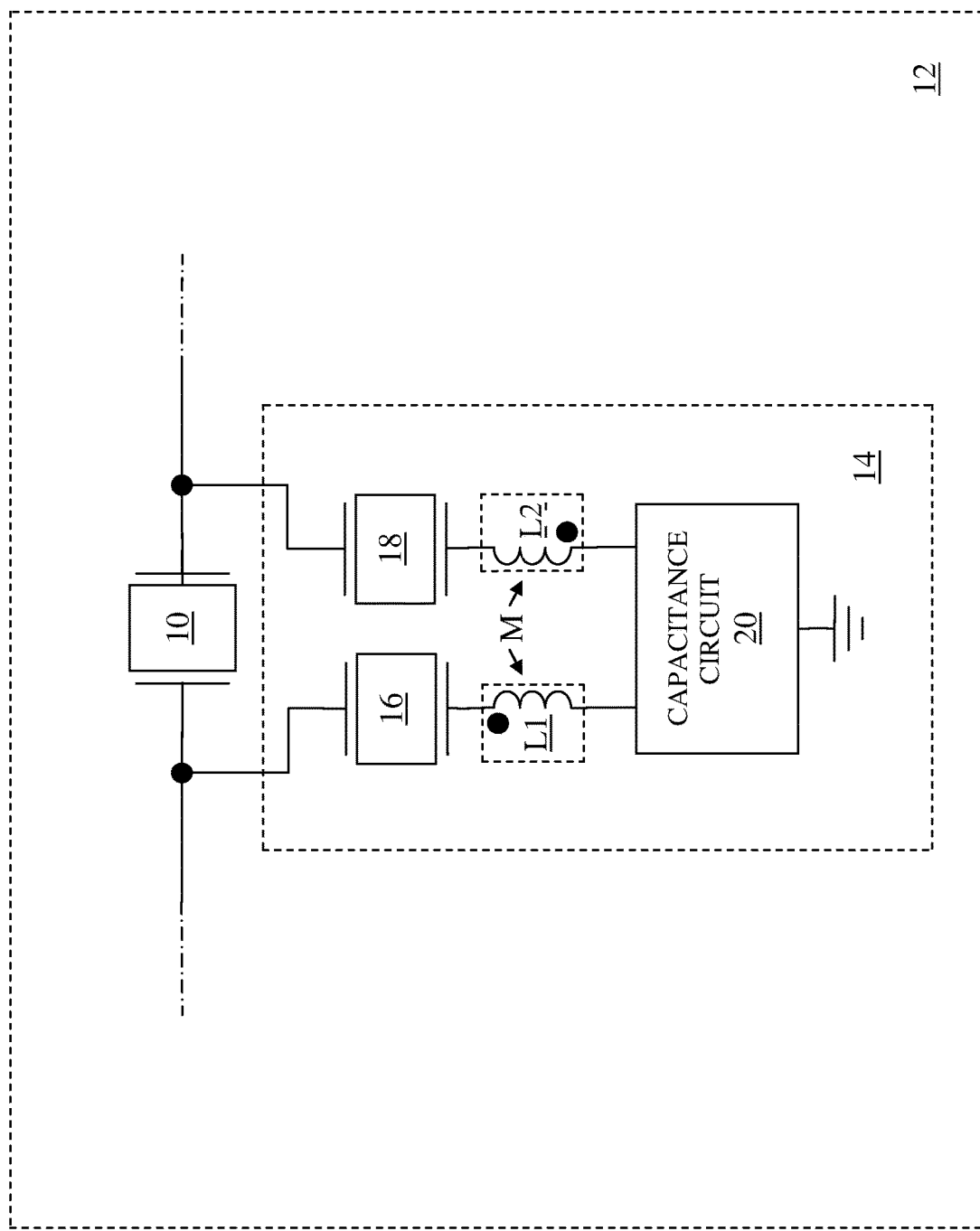
FIG. 4 shows the RF circuitry according to an alternate embodiment of the RF circuitry.

FIG. 4 shows the RF circuitry 12 according to an alternate embodiment of the RF circuitry 12. The RF circuitry 12 illustrated in FIG. 4 is similar to the RF circuitry 12 illustrated in FIG. 3, except in the RF circuitry 12 illustrated in FIG. 4, the first parallel capacitance compensation circuit 14 further includes a capacitance circuit 20. In general, the capacitance circuit 20 is coupled between the first inductive element L1 and the ground and is further coupled between the second inductive element L2 and the ground. In one embodiment of the capacitance circuit 20, the capacitance circuit 20 is used to optimize the first parallel capacitance compensation circuit 14 for improved compensation of the parallel capacitance CP (FIG. 1B) of the first ARFR 10.

Figure 5:
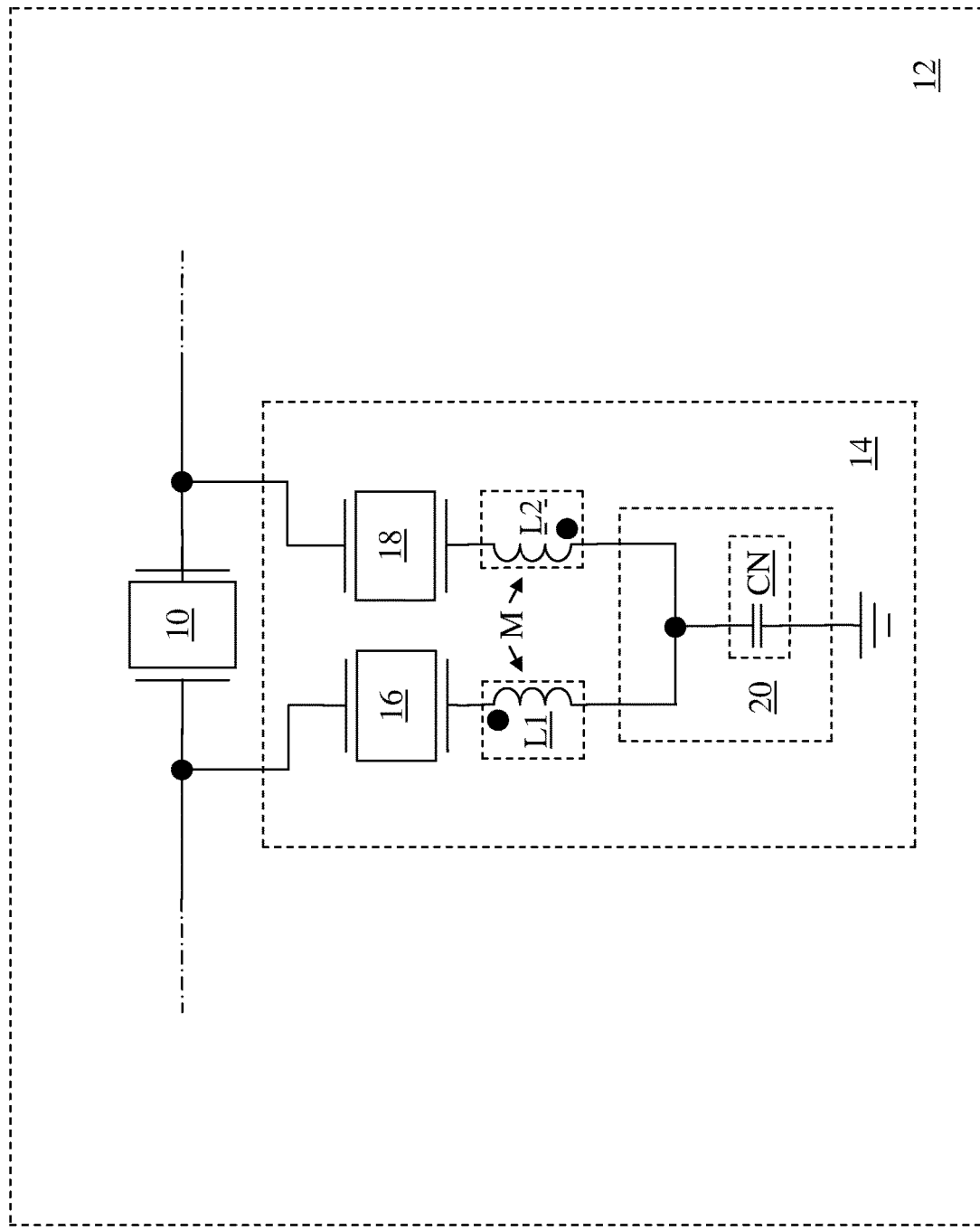
FIG. 5 shows details of a capacitance circuit illustrated in FIG. 4 according to one embodiment of the capacitance circuit.

FIG. 5 shows details of the capacitance circuit 20 illustrated in FIG. 4 according to one embodiment of the capacitance circuit 20. In the capacitance circuit 20 illustrated in FIG. 5, a first end of the first inductive element L1 is coupled to a first end of the second inductive element L2, such that the capacitance circuit 20 presents a shunt capacitance CN between ground and both of the first inductive element L1 and the second inductive element L2.

Figure 6:
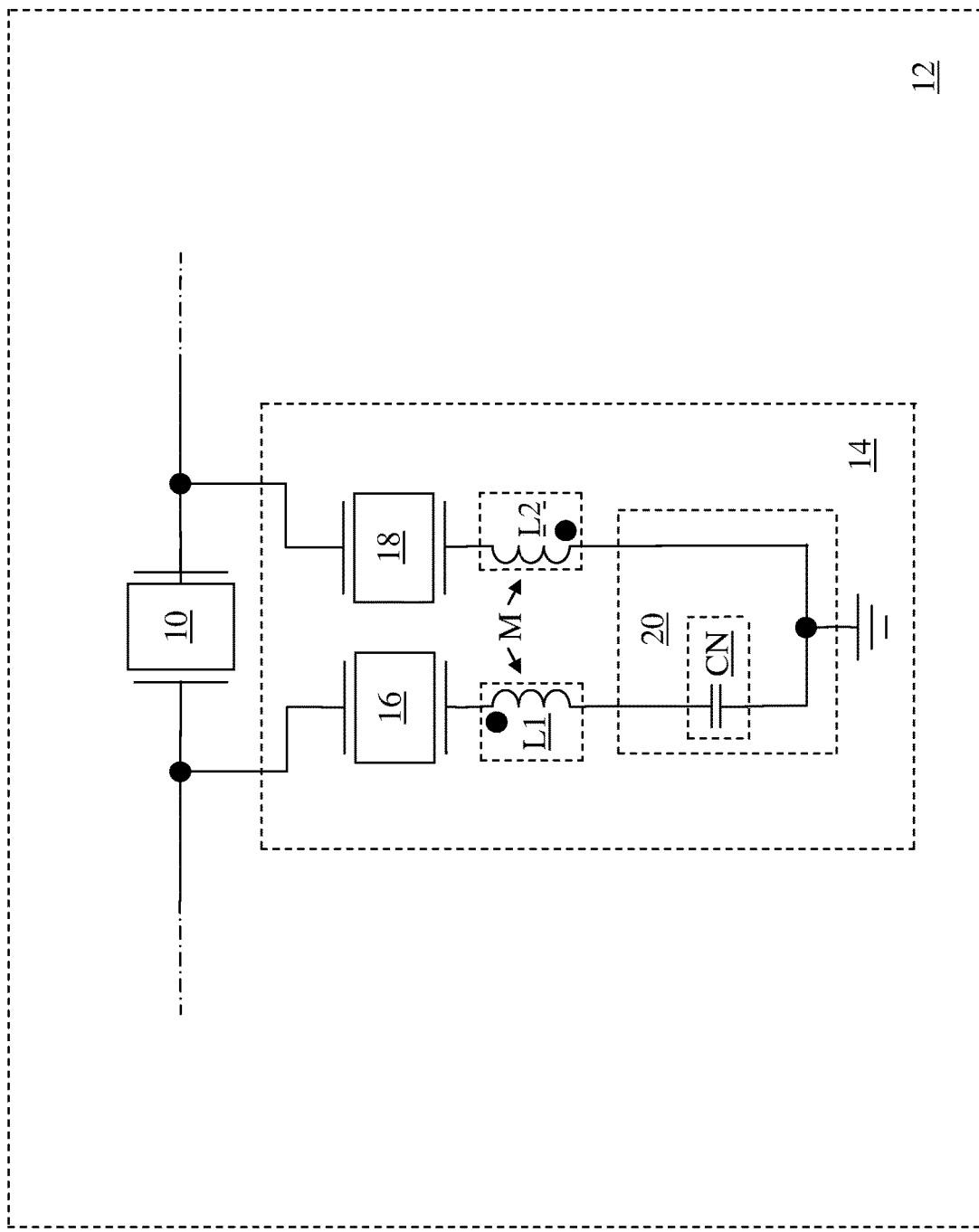
FIG. 6 shows details of the capacitance circuit illustrated in FIG. 4 according to an alternate embodiment of the capacitance circuit.

FIG. 6 shows details of the capacitance circuit 20 illustrated in FIG. 4 according to an alternate embodiment of the capacitance circuit 20. In the capacitance circuit 20 illustrated in FIG. 6, the second inductive element L2 is coupled between the second compensating ARFR 18 and ground, and the capacitance circuit 20 presents the shunt capacitance CN between ground and the first inductive element L1.

Figure 7:
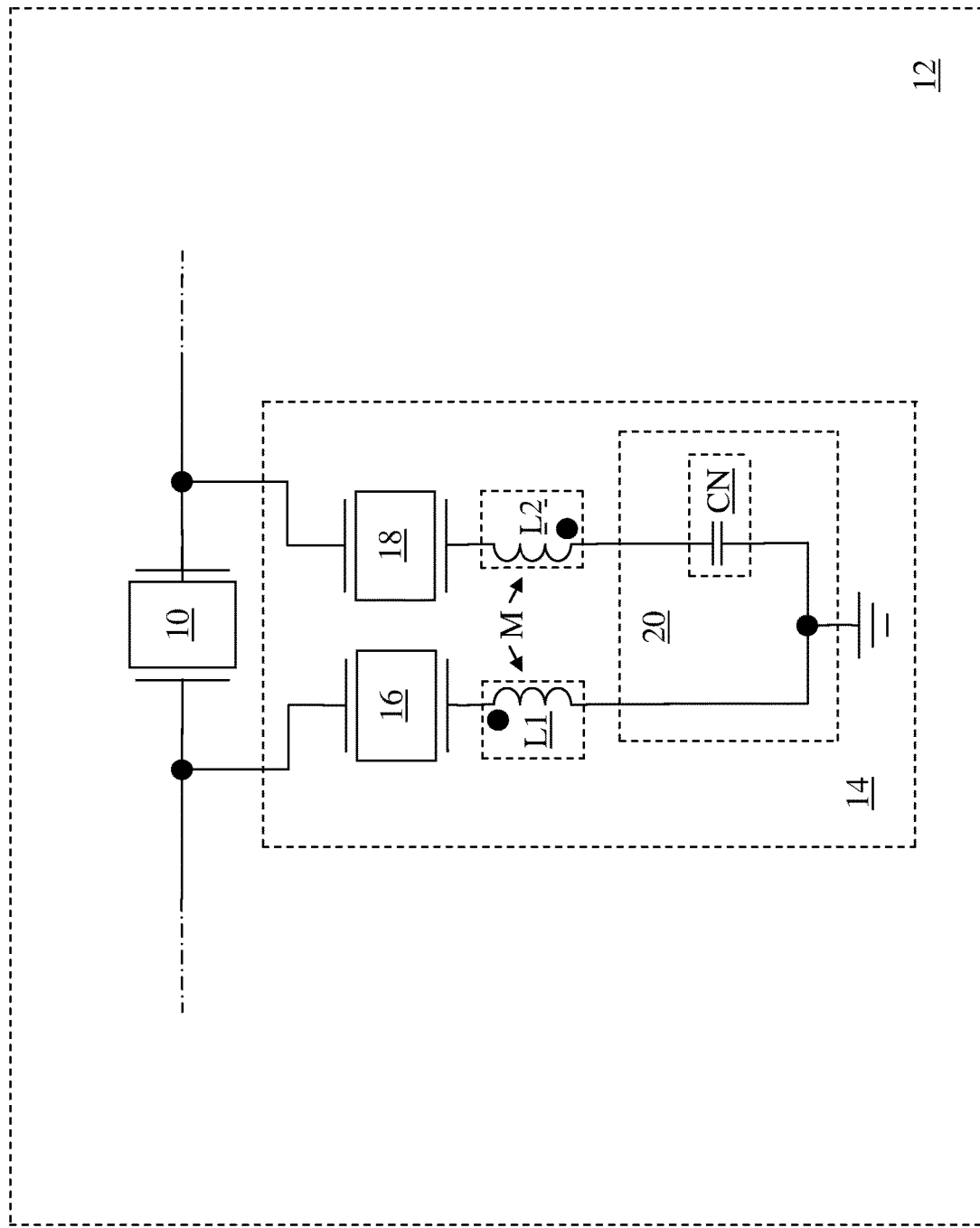
FIG. 7 shows details of the capacitance circuit illustrated in FIG. 4 according to an additional embodiment of the capacitance circuit.

FIG. 7 shows details of the capacitance circuit 20 illustrated in FIG. 4 according to an additional embodiment of the capacitance circuit 20. In the capacitance circuit 20 illustrated in FIG. 7, the first inductive element L1 is coupled between the first compensating ARFR 16 and ground, and the capacitance circuit 20 presents the shunt capacitance CN between ground and the second inductive element L2.

Figure 8:
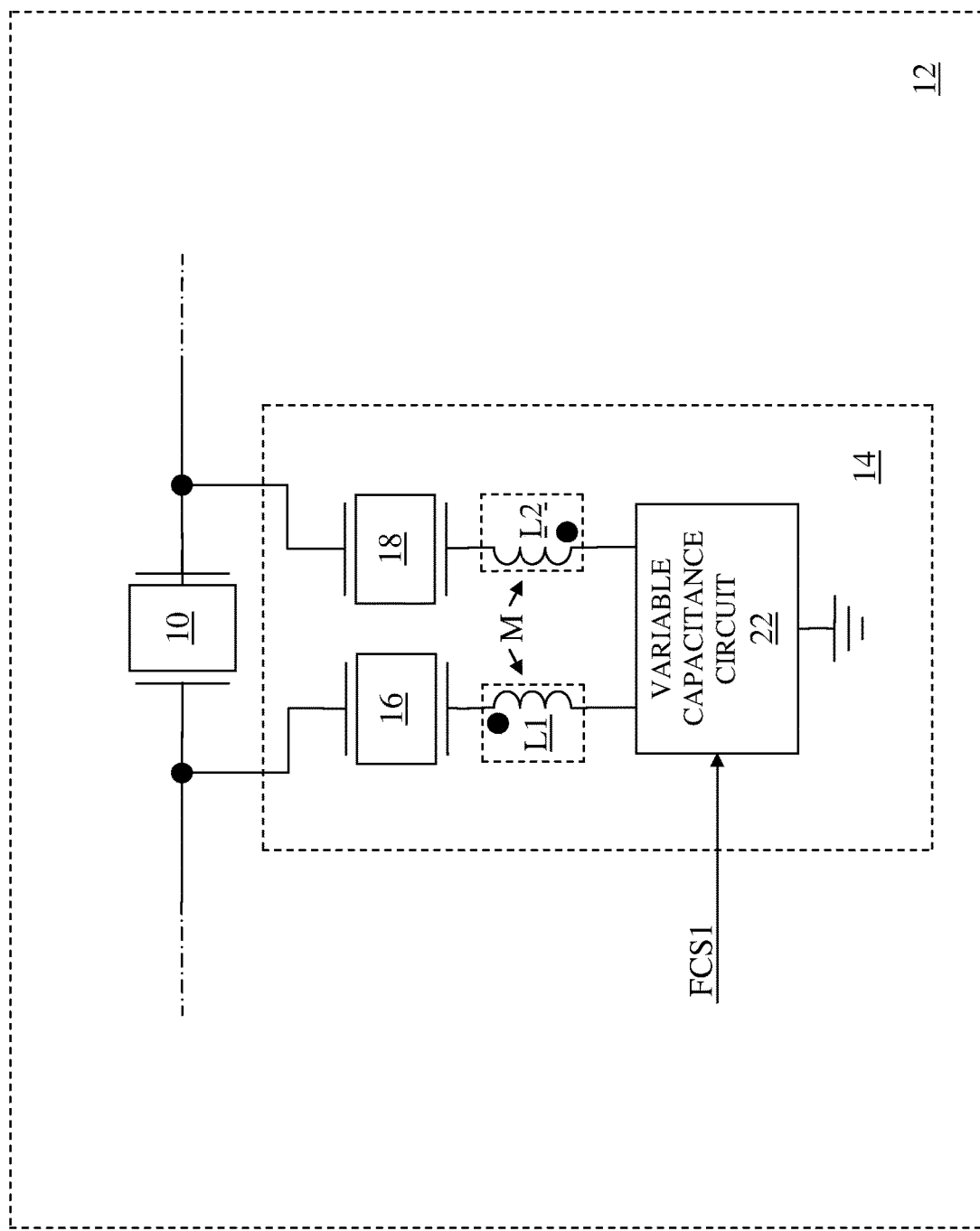
FIG. 8 shows the RF circuitry according to an additional embodiment of the RF circuitry.

FIG. 8 shows the RF circuitry 12 according to an additional embodiment of the RF circuitry 12. The RF circuitry 12 illustrated in FIG. 8 is similar to the RF circuitry 12 illustrated in FIG. 4, except in the RF circuitry 12 illustrated in FIG. 8, the capacitance circuit 20 is replaced with a variable capacitance circuit 22. In one embodiment of the variable capacitance circuit 22, the variable capacitance circuit 22 is used to vary the shunt capacitance CN illustrated in FIG. 5. In an alternate embodiment of the variable capacitance circuit 22, the variable capacitance circuit 22 is used to vary the shunt capacitance CN illustrated in FIG. 6. In an additional embodiment of the variable capacitance circuit 22, the variable capacitance circuit 22 is used to vary the shunt capacitance CN illustrated in FIG. 7.

In one embodiment of the variable capacitance circuit 22, the variable capacitance circuit 22 receives the first function configuration signal FCS1, such that the shunt capacitance CN is adjusted based on the first function configuration signal FCS1.

Figure 9:
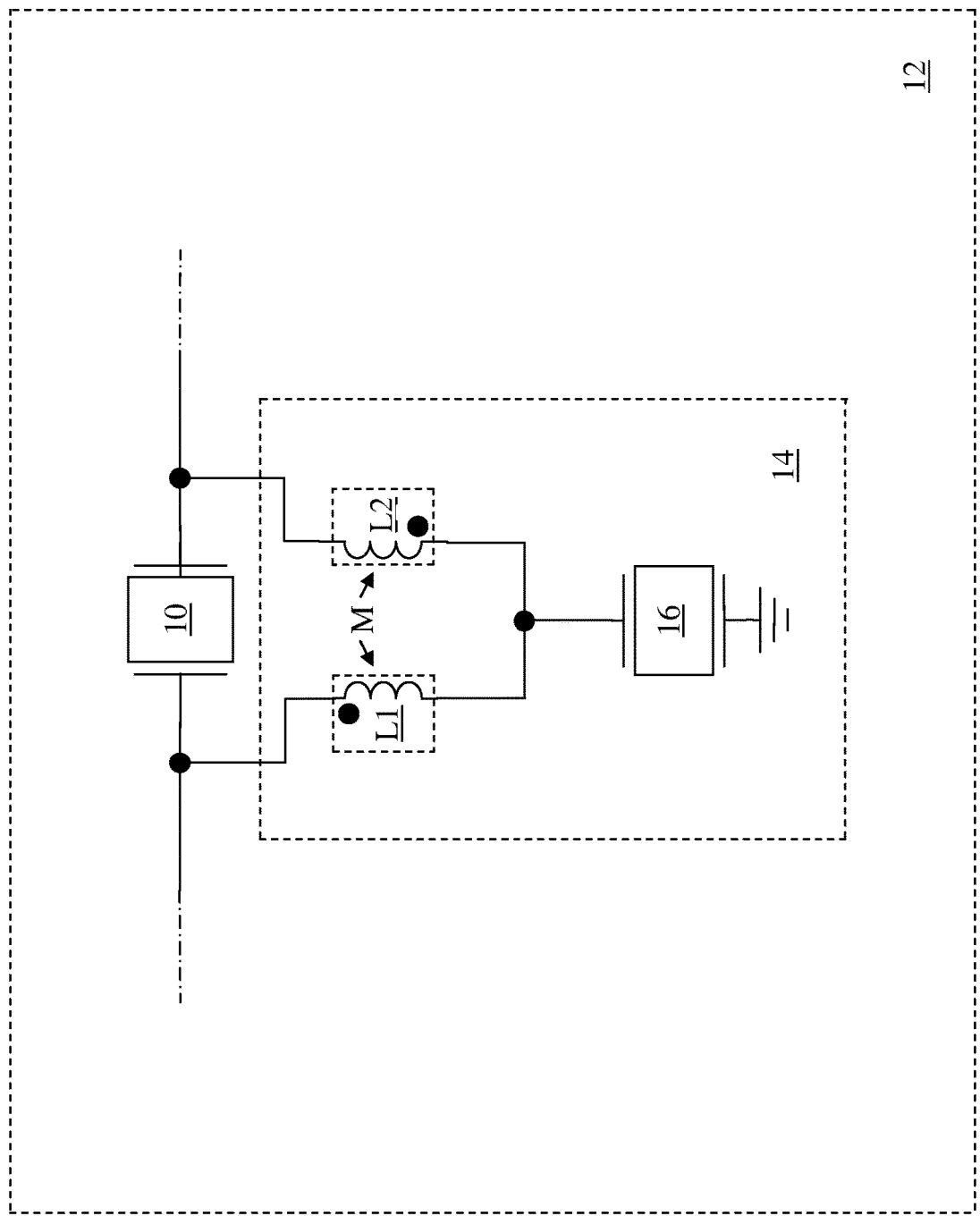
FIG. 9 shows the RF circuitry according to another embodiment of the RF circuitry.

FIG. 9 shows the RF circuitry 12 according to another embodiment of the RF circuitry 12. The RF circuitry 12 illustrated in FIG. 9 includes the first ARFR 10 and the first parallel capacitance compensation circuit 14, which includes the first compensating ARFR 16, the first inductive element L1, and the second inductive element L2.

The first inductive element L1 is coupled between the first compensating ARFR 16 and a first end of the first ARFR 10. The second inductive element L2 is coupled between the first compensating ARFR 16 and a second end of the first ARFR 10. The first inductive element L1 and the second inductive element L2 have mutual coupling M between them as illustrated in FIG. 9. Further, the first inductive element L1 and the second inductive element L2 are negatively coupled to one another as illustrated in FIG. 9. The first compensating ARFR 16, the first inductive element L1, and the second inductive element L2 at least partially compensate for the parallel capacitance CP (FIG. 1B) of the first ARFR 10. In general, in one embodiment of the RF circuitry 12, the first parallel capacitance compensation circuit 14 at least partially compensate for the parallel capacitance CP (FIG. 1B) of the first ARFR 10.

The first compensating ARFR 16 is coupled between the first inductive element L1 and ground. Additionally, the first compensating ARFR 16 is further coupled between the second inductive element L2 and the ground. In general, in one embodiment of the first parallel capacitance compensation circuit 14, the first parallel capacitance compensation circuit 14 is a passive circuit, which includes no active components.

In one embodiment of the first inductive element L1 and the second inductive element L2, an absolute value of a coefficient of coupling between the first inductive element L1 and the second inductive element L2 is greater than zero. In an alternate embodiment of the first inductive element L1 and the second inductive element L2, the absolute value of the coefficient of coupling between the first inductive element L1 and the second inductive element L2 is greater than 0.1. In an additional embodiment of the first inductive element L1 and the second inductive element L2, the absolute value of the coefficient of coupling between the first inductive element L1 and the second inductive element L2 is greater than 0.2.

In one embodiment of the first inductive element L1 and the second inductive element L2, the absolute value of the coefficient of coupling between the first inductive element L1 and the second inductive element L2 is less than 0.7. In an alternate embodiment of the first inductive element L1 and the second inductive element L2, the absolute value of the coefficient of coupling between the first inductive element L1 and the second inductive element L2 is less than 0.6. In an additional embodiment of the first inductive element L1 and the second inductive element L2, the absolute value of the coefficient of coupling between the first inductive element L1 and the second inductive element L2 is less than 0.5. In another embodiment of the first inductive element L1 and the second inductive element L2, the absolute value of the coefficient of coupling between the first inductive element L1 and the second inductive element L2 is less than 0.4. In a further embodiment of the first inductive element L1 and the second inductive element L2, the absolute value of the coefficient of coupling between the first inductive element L1 and the second inductive element L2 is less than 0.3.

In one embodiment of the first inductive element L1 and the second inductive element L2, an inductance of the first inductive element L1 is essentially equal to an inductance of the second inductive element L2. In an alternate embodiment of the first inductive element L1 and the second inductive element L2, the inductance of the first inductive element L1 is not equal to the inductance of the second inductive element L2.

In one embodiment of the first parallel capacitance compensation circuit 14, the first parallel capacitance compensation circuit 14 augments RF bandpass filtering behavior of the first ARFR 10. In one embodiment of the first parallel capacitance compensation circuit 14, the first parallel capacitance compensation circuit 14 increases a ratio of the parallel resonant frequency $F_P$ (FIG. 2B) to the series resonant frequency $F_S$ (FIG. 2B).

In one embodiment of the first parallel capacitance compensation circuit 14 and the first ARFR 10, the first parallel capacitance compensation circuit 14 and the first ARFR 10 function as an RF bandpass filtering element, such that the parallel resonant frequency $F_P$ (FIG. 2B) falls outside of a passband of the RF bandpass filtering element.

In one embodiment of the first parallel capacitance compensation circuit 14 and the first ARFR 10, the first parallel capacitance compensation circuit 14 is coupled across the first ARFR 10, such that the first parallel capacitance compensation circuit 14 presents a positive reactance across the first ARFR 10. A magnitude of the positive reactance is inversely related to frequency. Since the parallel capacitance CP (FIG. 1B) of the first ARFR 10 presents a negative reactance across the first ARFR 10, such that the negative reactance is inversely related to frequency, the positive reactance at least partially cancels the negative reactance, thereby at least partially compensating for the parallel capacitance CP (FIG. 1B) of the first ARFR 10.

In one embodiment of the first ARFR 10 and the first compensating ARFR 16, each of the first ARFR 10 and the first compensating ARFR 16 is a SAW RF resonator. In an alternate embodiment of the first ARFR 10 and the first compensating ARFR 16, each of the first ARFR 10 and the first compensating ARFR 16 is a BAW RF resonator.

Figure 10:
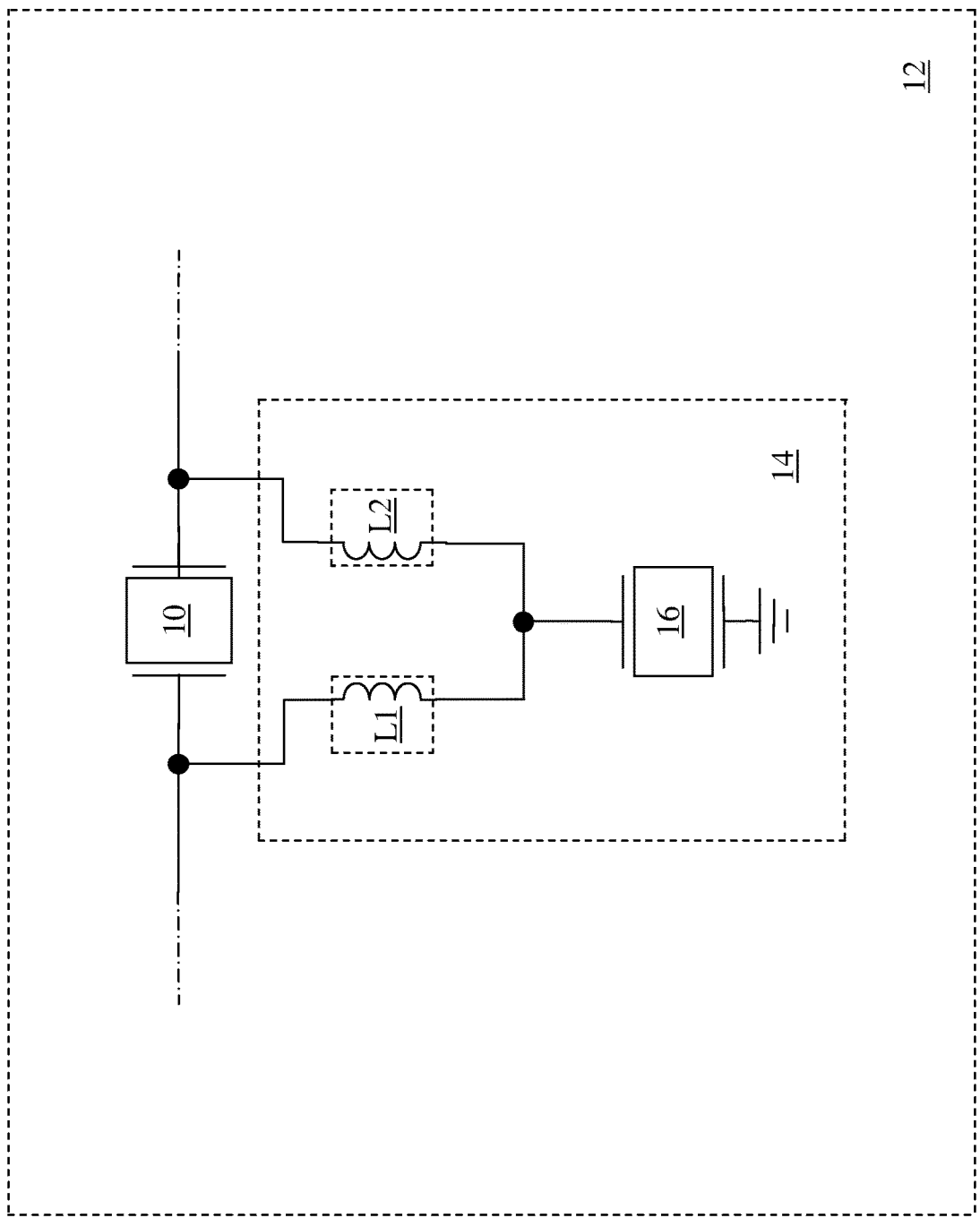
FIG. 10 shows the RF circuitry according to a further embodiment of the RF circuitry.

FIG. 10 shows the RF circuitry 12 according to a further embodiment of the RF circuitry 12. The RF circuitry 12 illustrated in FIG. 10 is similar to the RF circuitry 12 illustrated in FIG. 9, except in the RF circuitry 12 illustrated in FIG. 10, there is no intended mutual coupling M (FIG. 9) between the first inductive element L1 and the second inductive element L2. As such, the absolute value of the coefficient of coupling between the first inductive element L1 and the second inductive element L2 is essentially equal to zero.

FIG. 11A shows the first ARFR 10 and the load resistive element RL according to the prior art. The first ARFR 10 and the load resistive element RL illustrated in FIG. 11A are similar to the first ARFR 10 and the load resistive element RL illustrated in FIG. 1A.

FIG. 11B shows the first ARFR 10, the load resistive element RL, and the first parallel capacitance compensation circuit 14 according to one embodiment of the first ARFR 10, the load resistive element RL, and the first parallel capacitance compensation circuit 14. The first ARFR 10 and the load resistive element RL illustrated in FIG. 11B is similar to the first ARFR 10 and the load resistive element RL illustrated in FIG. 1A, except in FIG. 11B, the first parallel capacitance compensation circuit 14 is coupled across the first ARFR 10.

The first parallel capacitance compensation circuit 14 illustrated in FIG. 11B may include any of the embodiments of the first parallel capacitance compensation circuit 14 illustrated in FIGS. 3, 4, 5, 6, 7, 8, 9, 10, or any combination thereof.

FIG. 12A is a graph illustrating a magnitude of the RF output signal RFT illustrated in FIG. 11A according to the prior art. The magnitude of the RF output signal RFT is shown versus frequency of the RF output signal RFT. A preferred passband is illustrated. The RF output signal RFT illustrated in FIG. 12A has insufficient bandwidth to support the preferred passband. Additionally, an out of band magnitude of the RF output signal RFT increases as the frequency of the RF output signal RFT increases due to the parallel capacitance CP (FIG. 1B). As such, the first ARFR 10 and the load resistive element RL illustrated in FIG. 11A do not provide good out of band rejection of the RF output signal RFT.

FIG. 12B is a graph illustrating a magnitude of the RF output signal RFT illustrated in FIG. 11B according to one embodiment of the first ARFR 10, the load resistive element RL, and the first parallel capacitance compensation circuit 14. By adding the first parallel capacitance compensation circuit 14, the first parallel capacitance compensation circuit 14 at least partially compensates for the parallel capacitance CP (FIG. 1B).

As a result, the RF output signal RFT has adequate bandwidth to support the preferred passband. Also, while the out of band magnitude of the RF output signal RFT illustrated in FIG. 12B increases as the frequency of the RF output signal RFT increases, the out of band magnitude of the RF output signal RFT illustrated in FIG. 12B is significantly less than the out of band magnitude of the RF output signal RFT illustrated in FIG. 12A.

Figure 13:
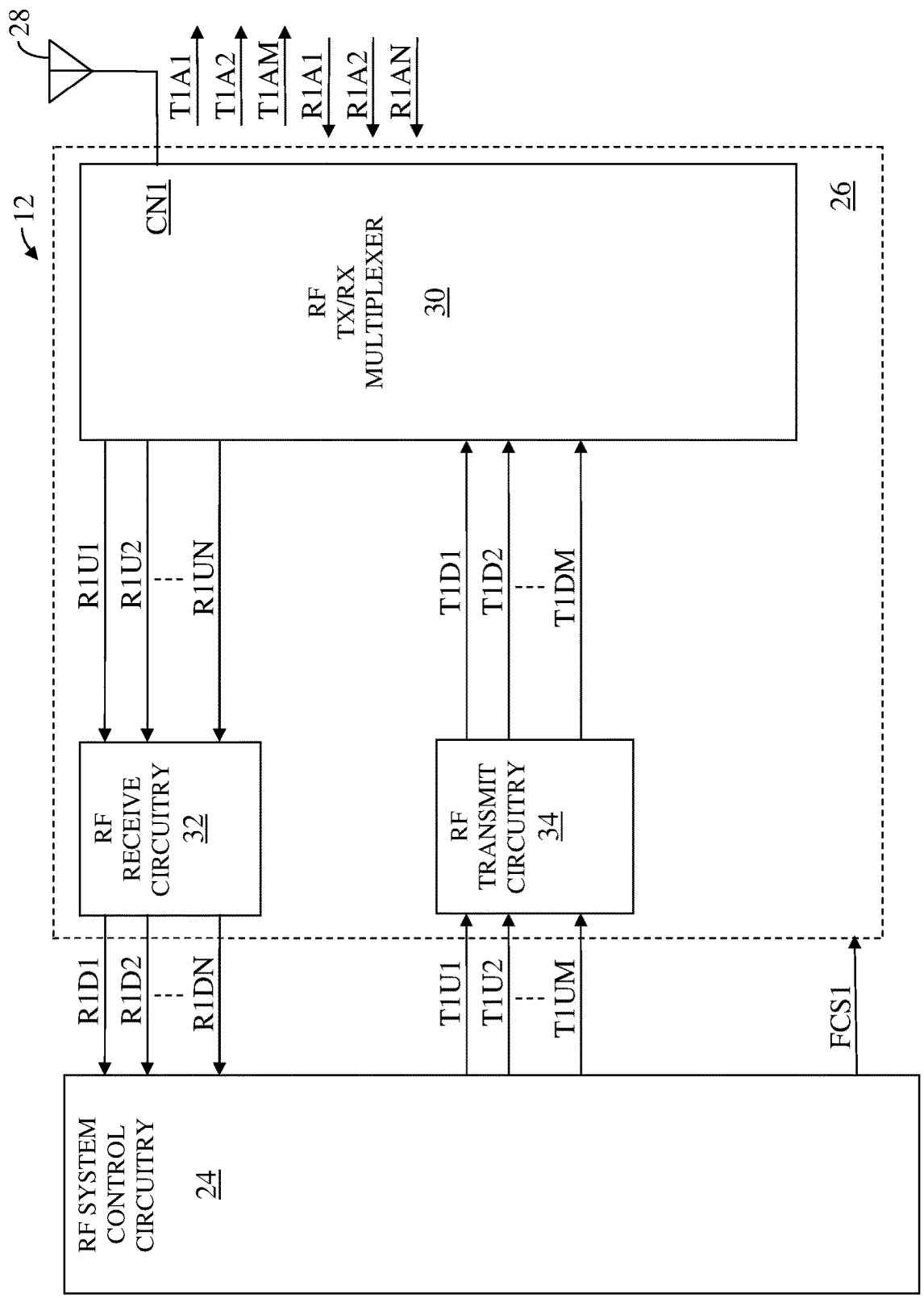
FIG. 13 shows the RF circuitry according to one embodiment of the RF circuitry.

FIG. 13 shows the RF circuitry 12 according to one embodiment of the RF circuitry 12. The RF circuitry 12 includes RF system control circuitry 24, RF front-end circuitry 26, and a first RF antenna 28. The RF front-end circuitry 26 includes an RF TX/RX multiplexer 30, RF receive circuitry 32, and RF transmit circuitry 34. The RF TX/RX multiplexer 30 has a first common connection node CN1, which is coupled to the first RF antenna 28. In one embodiment of the RF TX/RX multiplexer 30, the first common connection node CN1 is directly coupled to the first RF antenna 28. The RF system control circuitry 24 provides a first function configuration signal FCS1 to the RF front-end circuitry 26. As such, in one embodiment of the RF front-end circuitry 26, the RF system control circuitry 24 configures any or all of the RF TX/RX multiplexer 30, the RF receive circuitry 32, and the RF transmit circuitry 34 using the first function configuration signal FCS1.

In one embodiment of the RF system control circuitry 24, the RF system control circuitry 24 provides a first antenna, first upstream RF transmit signal T1U1, a first antenna, second upstream RF transmit signal T1U2, and up to and including a first antenna, $M^{TH}$ upstream RF transmit signal T1UM to the RF transmit circuitry 34. In general, the RF system control circuitry 24 provides a group of first antenna, upstream RF transmit signals T1U1, T1U2, T1UM to the RF transmit circuitry 34.

The RF transmit circuitry 34 processes the first antenna, first upstream RF transmit signal T1U1 to provide a first antenna, first downstream RF transmit signal T1D1 to the RF TX/RX multiplexer 30, the first antenna, second upstream RF transmit signal T1U2 to provide a first antenna, second downstream RF transmit signal T1D2 to the RF TX/RX multiplexer 30, and up to and including the first antenna, $M^{TH}$ upstream RF transmit signal T1UM to provide a first antenna, $M^{TH}$ downstream RF transmit signal T1DM to the RF TX/RX multiplexer 30. In general, the RF transmit circuitry 34 provides a group of first antenna, downstream RF transmit signals T1D1, T1D2, T1DM to the RF TX/RX multiplexer 30.

In one embodiment of the RF system control circuitry 24, the RF system control circuitry 24 provides at least one of the group of first antenna, upstream RF transmit signals T1U1, T1U2, T1UM to the RF transmit circuitry 34, which processes and forwards any or all of the group of first antenna, upstream RF transmit signals T1U1, T1U2, T1UM to provide a corresponding any or all of the group of first antenna, downstream RF transmit signals T1D1, T1D2, T1DM to the RF TX/RX multiplexer 30. The RF TX/RX multiplexer 30 receives, bandpass filters, and forwards the corresponding any or all of the group of first antenna, downstream RF transmit signals T1D1, T1D2, T1DM to provide a corresponding any or all of a first antenna, first RF antenna transmit signal T1A1, a first antenna, second RF antenna transmit signal T1A2, and up to and including a first antenna, $M^{TH}$ RF antenna transmit signal T1AM to the first RF antenna 28 via the first common connection node CN1.

The RF transmit circuitry 34 may include up-conversion circuitry, amplification circuitry, power supply circuitry, filtering circuitry, switching circuitry, combining circuitry, splitting circuitry, dividing circuitry, clocking circuitry, the like, or any combination thereof to process any or all of the group of first antenna, upstream RF transmit signals T1U1, T1U2, T1UM. In one embodiment of the RF transmit circuitry 34, the RF transmit circuitry 34 includes circuitry to reduce interference of RF receive signals in the RF TX/RX multiplexer 30 by processing the group of first antenna, downstream RF transmit signals T1D1, T1D2, T1DM in the RF TX/RX multiplexer 30.

In one embodiment of the RF TX/RX multiplexer 30, the RF TX/RX multiplexer 30 receives any or all of a first antenna, first RF receive signal R1A1; a first antenna, second RF receive signal R1A2; and up to and including a first antenna, $N^{TH}$ RF receive signal R1AN; which are received via the first RF antenna 28. In general, the RF TX/RX multiplexer 30 receives any or all of a group of first antenna, RF receive signals R1A1, R1A2, R1AN from the first common connection node CN1. In one embodiment of the group of first antenna, RF receive signals R1A1, R1A2, R1AN, any or all of the group of first antenna, RF receive signals R1A1, R1A2, R1AN are received simultaneously, such that the RF TX/RX multiplexer 30 supports receive downlink carrier aggregation (RXDLCA).

The RF TX/RX multiplexer 30 processes and forwards any or all of the group of first antenna, RF receive signals R1A1, R1A2, R1AN from the first common connection node CN1 to provide any or all of a first antenna, first upstream RF receive signal R1U1, a first antenna, second upstream RF receive signal R1U2, and up to and including a first antenna, $N^{TH}$ upstream RF receive signal R1UN. In general, the RF TX/RX multiplexer 30 provides any or all of a group of first antenna, upstream RF receive signals R1U1, R1U2, R1UN to the RF receive circuitry 32.

In one embodiment of the RF receive circuitry 32, the RF receive circuitry 32 receives and processes any or all of the group of the first antenna, upstream RF receive signals R1U1, R1U2, R1UN to provide a corresponding any or all of a group of first antenna, downstream RF receive signals R1D1, R1D2, R1DN.

In an additional embodiment of the RF receive circuitry 32, the RF receive circuitry 32 simultaneously receives and processes any or all of the group of first antenna, upstream RF receive signals R1U1, R1U2, R1UN. As such, the RF receive circuitry 32 supports RXDLCA. The RF receive circuitry 32 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF front-end circuitry 26, any or all of the group of first antenna, RF receive signals R1A1, R1A2, R1AN, any or all of the group of first antenna, RF antenna transmit signals T1A1, T1A2, T1AM, any or all of the group of first antenna, upstream RF receive signals R1U1, R1U2, R1UN, any or all of the group of first antenna, downstream RF receive signals R1D1, R1D2, R1DN, any or all of the group of upstream RF transmit signals T1U1, T1U2, T1UM, and any or all of the group of downstream RF transmit signals T1D1, T1D2, T1DM are omitted.

In one embodiment of the RF system control circuitry 24, the RF system control circuitry 24 provides the first function configuration signal FCS1 to the RF TX/RX multiplexer 30, the RF receive circuitry 32, and the RF transmit circuitry 34. As such, the RF system control circuitry 24 may configure, tune, adjust, enable, disable, vary, or any combination thereof, circuits within the RF TX/RX multiplexer 30, the RF receive circuitry 32, the RF transmit circuitry 34, or any combination thereof, as necessary, using the first function configuration signal FCS1.

Figure 14:
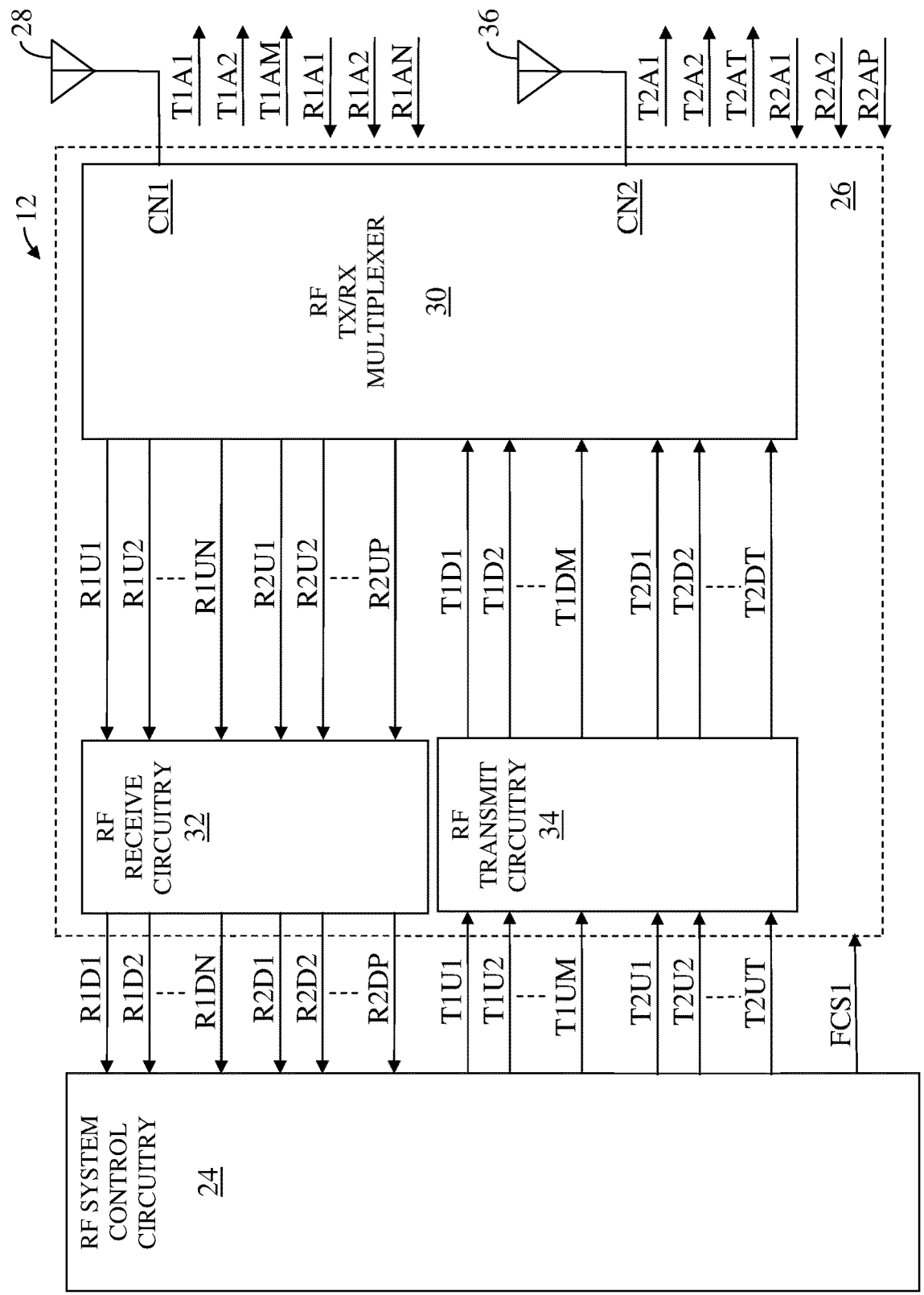
FIG. 14 shows the RF circuitry according to an alternate embodiment of the RF circuitry.

FIG. 14 shows the RF circuitry 12 according to an alternate embodiment of the RF circuitry 12. The RF circuitry 12 illustrated in FIG. 14 is similar to the RF circuitry 12 illustrated in FIG. 13, except the RF circuitry 12 illustrated in FIG. 14 further includes a second RF antenna 36. Additionally, the RF TX/RX multiplexer 30 further has a second common connection node CN2, which is coupled to the second RF antenna 36.

In one embodiment of the RF system control circuitry 24, the RF system control circuitry 24 further provides a second antenna, first upstream RF transmit signal T2U1, a second antenna, second upstream RF transmit signal T2U2, and up to and including a second antenna, $T^{TH}$ upstream RF transmit signal T2UT to the RF transmit circuitry 34. In general, the RF system control circuitry 24 provides the group of first antenna, upstream RF transmit signals T1U1, T1U2, T1UM and a group of second antenna, upstream RF transmit signals T2U1, T2U2, T2UT to the RF transmit circuitry 34.

The RF transmit circuitry 34 further processes the second antenna, first upstream RF transmit signal T2U1 to provide a second antenna, first downstream RF transmit signal T2D1 to the RF TX/RX multiplexer 30, the second antenna, second upstream RF transmit signal T2U2 to provide a second antenna, second downstream RF transmit signal T2D2 to the RF TX/RX multiplexer 30, and up to and including the second antenna, $T^{TH}$ upstream RF transmit signal T2UT to provide a second antenna, $T^{TH}$ downstream RF transmit signal T2DT to the RF TX/RX multiplexer 30. In general, the RF transmit circuitry 34 provides the group of first antenna, downstream RF transmit signals T1D1, T1D2, T1DM to the RF TX/RX multiplexer 30 and further provides a group of second antenna, downstream RF transmit signals T2D1, T2D2, T2DT to the RF TX/RX multiplexer 30.

In one embodiment of the RF system control circuitry 24, the RF system control circuitry 24 further provides at least one of the group of second antenna, upstream RF transmit signals T2U1, T2U2, T2UT to the RF transmit circuitry 34, which processes and forwards any or all of the group of second antenna, upstream RF transmit signals T2U1, T2U2, T2UT to provide a corresponding any or all of the group of second antenna, downstream RF transmit signals T2D1, T2D2, T2DT to the RF TX/RX multiplexer 30. The RF TX/RX multiplexer 30 receives, bandpass filters, and forwards the corresponding any or all of the group of second antenna, downstream RF transmit signals T2D1, T2D2, T2DT to provide a corresponding any or all of a second antenna, first RF antenna transmit signal T2A1; a second antenna, second RF antenna transmit signal T2A2; and up to and including a second antenna, $T^{TH}$ RF antenna transmit signal T2AT to the second RF antenna 36 via the second common connection node CN2.

The RF transmit circuitry 34 may include up-conversion circuitry, amplification circuitry, power supply circuitry, filtering circuitry, switching circuitry, combining circuitry, splitting circuitry, dividing circuitry, clocking circuitry, the like, or any combination thereof to process any or all of the group of first antenna, upstream RF transmit signals T1U1, T1U2, T1UM and the group of second antenna, upstream RF transmit signals T2U1, T2U2, T2UT. In one embodiment of the RF transmit circuitry 34, the RF transmit circuitry 34 includes circuitry to reduce interference of RF receive signals in the RF TX/RX multiplexer 30 by processing the group of first antenna, downstream RF transmit signals T1D1, T1D2, T1DM and the group of second antenna, downstream RF transmit signals T2D1, T2D2, T2DT in the RF TX/RX multiplexer 30.

In one embodiment of the RF TX/RX multiplexer 30, the RF TX/RX multiplexer 30 further receives any or all of a second antenna, first RF receive signal R2A1; a second antenna, second RF receive signal R2A2; and up to and including a second antenna, $P^{TH}$ RF receive signal R2AP; which are received via the second RF antenna 36. In general, the RF TX/RX multiplexer 30 further receives any or all of a group of second antenna, RF receive signals R2A1, R2A2, R2AP from the second common connection node CN2. In one embodiment of the group of first antenna, RF receive signals R1A1, R1A2, R1AN and the group of second antenna, RF receive signals R2A1, R2A2, R2AP, any or all of the group of first antenna, RF receive signals R1A1, R1A2, R1AN and the group of second antenna, RF receive signals R2A1, R2A2, R2AP are received simultaneously, such that the RF TX/RX multiplexer 30 supports receive downlink carrier aggregation (RXDLCA).

The RF TX/RX multiplexer 30 processes and forwards any or all of the group of second antenna, RF receive signals R2A1, R2A2, R1AP from the second common connection node CN2 to provide any or all of a second antenna, first upstream RF receive signal R2U1, a second antenna, second upstream RF receive signal R2U2, and up to and including a second antenna, $P^{TH}$ upstream RF receive signal R2UP. In general, the RF TX/RX multiplexer 30 provides any or all of the group of first antenna, upstream RF receive signals R1U1, R1U2, R1UN and the group of second antenna, upstream RF receive signals R2U1, R2U2, R2UP to the RF receive circuitry 32.

In one embodiment of the RF receive circuitry 32, the RF receive circuitry 32 receives and processes any or all of the group of the first antenna, upstream RF receive signals R1U1, R1U2, R1UN and the group of second antenna, upstream RF receive signals R2U1, R2U2, R2UP to provide a corresponding any or all of the group of first antenna, downstream RF receive signals R1D1, R1D2, R1DN and a group of second antenna, downstream RF receive signals R2D1, R2D2, R2DP.

In an additional embodiment of the RF receive circuitry 32, the RF receive circuitry 32 simultaneously receives and processes any or all of the group of first antenna, upstream RF receive signals R1U1, R1U2, R1UN and the group of second antenna, upstream RF receive signals R2U1, R2U2, R2UP. As such, the RF receive circuitry 32 supports RXDLCA. The RF receive circuitry 32 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF front-end circuitry 26, any or all of the group of first antenna, RF receive signals R1A1, R1A2, R1AN, any or all of the group of second antenna, RF receive signals R2A1, R2A2, R1AP, any or all of the group of first antenna, RF antenna transmit signals T1A1, T1A2, T1AM, any or all of the group of second antenna, RF antenna transmit signals T2A1, T2A2, T2AT, any or all of the group of first antenna, upstream RF receive signals R1U1, R1U2, R1UN, any or all of the group of second antenna, upstream RF receive signals R2U1, R2U2, R2UP, any or all of the group of first antenna, downstream RF receive signals R1D1, R1D2, R1DN, any or all of the group of second antenna, downstream RF receive signals R2D1, R2D2, R2DP, any or all of the group of first antenna, upstream RF transmit signals T1U1, T1U2, T1UM, any or all of the group of second antenna, upstream RF transmit signals T2U1, T2U2, T2UT, any or all of the group of first antenna, downstream RF transmit signals T1D1, T1D2, T1DM, and any or all of the group of second antenna, downstream RF transmit signals T2D1, T2D2, T2DT are omitted.

Figure 15:
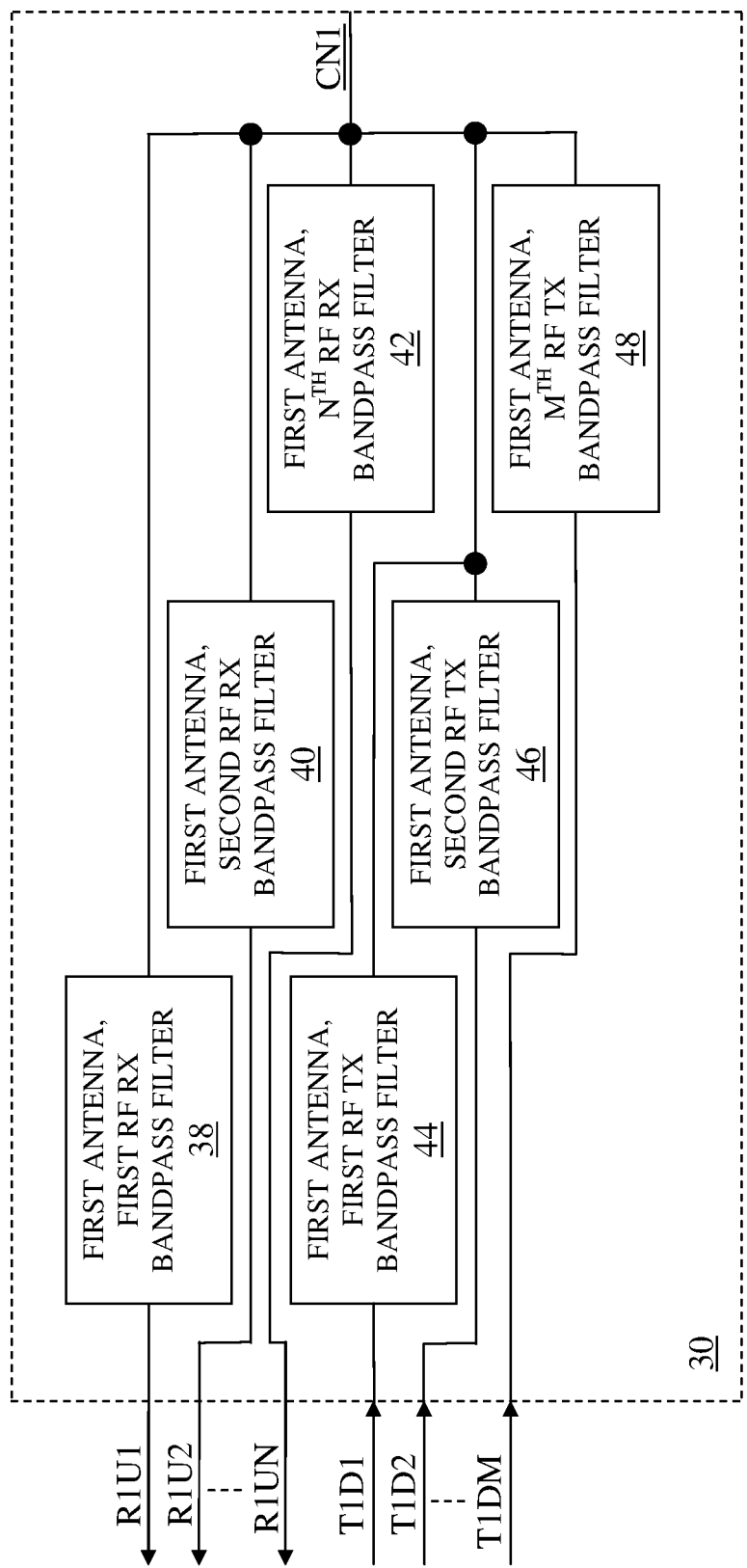
FIG. 15 shows details of the RF TX/RX multiplexer illustrated in FIG. 13 according to one embodiment of the RF TX/RX multiplexer.

FIG. 15 shows details of the RF TX/RX multiplexer 30 illustrated in FIG. 13 according to one embodiment of the RF TX/RX multiplexer 30. The RF TX/RX multiplexer 30 includes a first antenna, first RF RX bandpass filter 38, a first antenna, second RF RX bandpass filter 40, and up to and including a first antenna, $N^{TH}$ RF RX bandpass filter 42, a first antenna, first RF TX bandpass filter 44, a first antenna, second RF TX bandpass filter 46, and up to and including a first antenna, $M^{TH}$ RF TX bandpass filter 48. Each of the first antenna, RF bandpass filters 38, 40, 42, 44, 46, 48 illustrated in FIG. 15 is coupled to the first common connection node CN1.

In one embodiment of the first antenna, RF RX bandpass filters 38, 40, 42, each of the first antenna, RF RX bandpass filters 38, 40, 42 has a corresponding passband that is associated with a corresponding RF receive communications band. In one embodiment of the first antenna, RF TX bandpass filters 44, 46, 48, each of the first antenna, RF TX bandpass filters 44, 46, 48 has a corresponding passband that is associated with a corresponding RF transmit communications band. In one embodiment of the RF TX/RX multiplexer 30, any or all of the first antenna, RF bandpass filters 38, 40, 42, 44, 46, 48 is omitted.

In one embodiment of the first antenna, first RF RX bandpass filter 38, the first antenna, first RF RX bandpass filter 38 receives and filters the first antenna, first RF receive signal R1A1 (FIG. 13) via the first RF antenna 28 (FIG. 13) and the first common connection node CN1 to provide the first antenna, first upstream RF receive signal R1U1. In one embodiment of the first antenna, second RF RX bandpass filter 40, the first antenna, second RF RX bandpass filter 40 receives and filters the first antenna, second RF receive signal R1A2 (FIG. 13) via the first RF antenna 28 (FIG. 13) and the first common connection node CN1 to provide the first antenna, second upstream RF receive signal R1U2. In one embodiment of the first antenna, $N^{TH}$ RF RX bandpass filter 42, the first antenna, $N^{TH}$ RF RX bandpass filter 42 receives and filters the first antenna, $N^{TH}$ RF receive signal R1AN (FIG. 13) via the first RF antenna 28 (FIG. 13) and the first common connection node CN1 to provide the first antenna, $N^{TH}$ upstream RF receive signal R1UN.

In one embodiment of the first antenna, first RF TX bandpass filter 44, the first antenna, first RF TX bandpass filter 44 receives and filters the first antenna, first downstream RF transmit signal T1D1 to provide the first antenna, first RF antenna transmit signal T1A1 (FIG. 13) via first common connection node CN1 and the first RF antenna 28 (FIG. 13). In one embodiment of the first antenna, second RF TX bandpass filter 46, the first antenna, second RF TX bandpass filter 46 receives and filters the first antenna, second downstream RF transmit signal T1D2 to provide the first antenna, second RF antenna transmit signal T1A2 (FIG. 13) via first common connection node CN1 and the first RF antenna 28 (FIG. 13). In one embodiment of the first antenna, $M^{TH}$ RF TX bandpass filter 48, the first antenna, $M^{TH}$ RF TX bandpass filter 48 receives and filters the first antenna, $M^{TH}$ downstream RF transmit signal T1DM to provide the first antenna, $M^{TH}$ RF antenna transmit signal T1AM (FIG. 13) via first common connection node CN1 and the first RF antenna 28 (FIG. 13).

Figure 16:
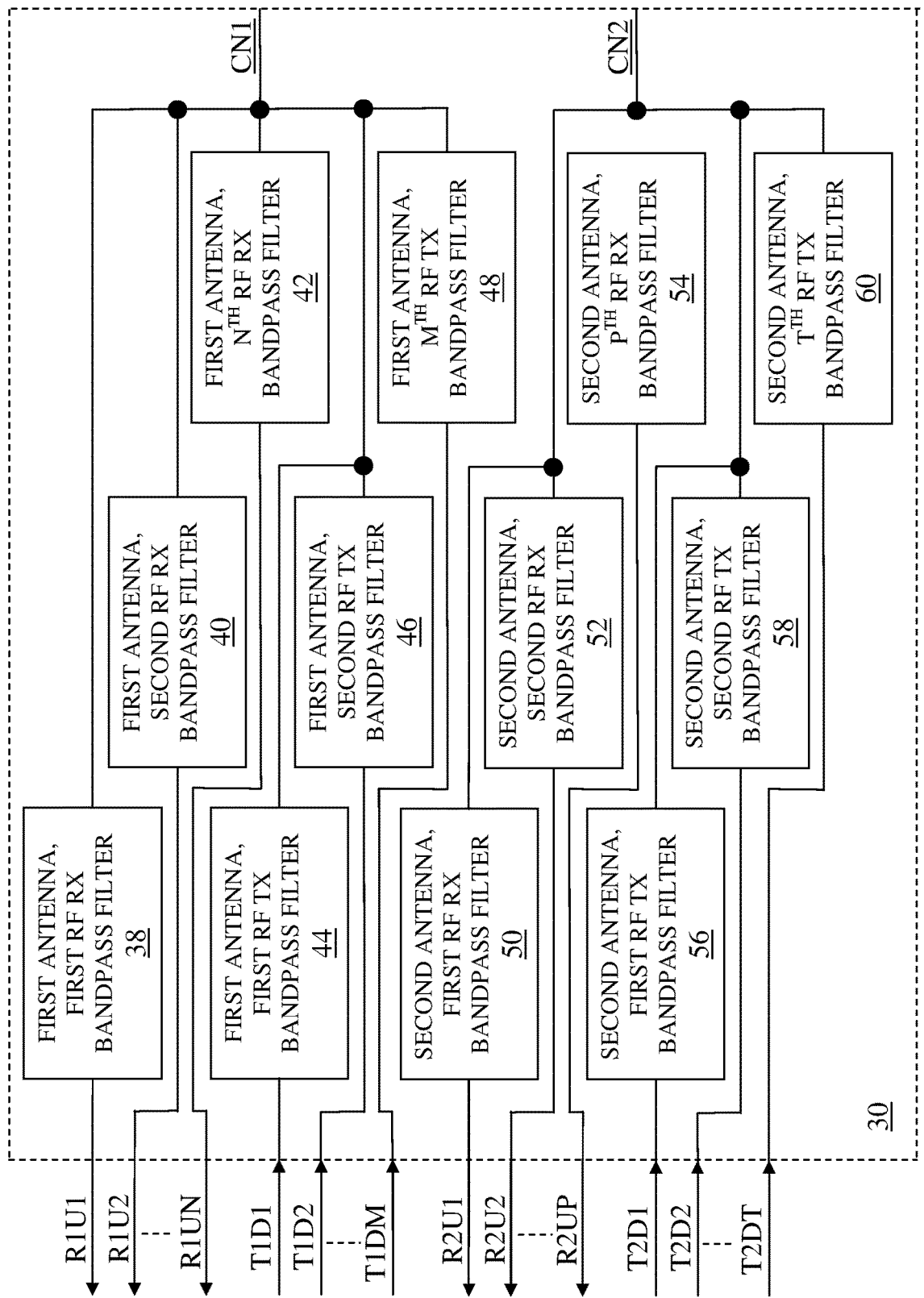
FIG. 16 shows details of the RF TX/RX multiplexer illustrated in FIG. 14 according to an alternate embodiment of the RF TX/RX multiplexer.

FIG. 16 shows details of the RF TX/RX multiplexer 30 illustrated in FIG. 14 according to an alternate embodiment of the RF TX/RX multiplexer 30. The RF TX/RX multiplexer 30 illustrated in FIG. 16 is similar to the RF TX/RX multiplexer 30 illustrated in FIG. 15 further includes a second antenna, first RF RX bandpass filter 50, a second antenna, second RF RX bandpass filter 52, a second antenna, $P^{TH}$ RF RX bandpass filter 54, a second antenna, first RF TX bandpass filter 56, a second antenna, second RF TX bandpass filter 58, and a second antenna, $T^{TH}$ RF TX bandpass filter 60.

Each of the first antenna, RF bandpass filters 38, 40, 42, 44, 46, 48 illustrated in FIG. 16 is coupled to the first common connection node CN1 and each of the second antenna, RF bandpass filters 50, 52, 54, 56, 58, 60 illustrated in FIG. 16 is coupled to the second common connection node CN2.

In one embodiment of the second antenna, RF RX bandpass filters 50, 52, 54, each of the second antenna, RF RX bandpass filters 50, 52, 54 has a corresponding passband that is associated with a corresponding RF receive communications band. In one embodiment of the second antenna, RF TX bandpass filters 56, 58, 60, each of the second antenna, RF TX bandpass filters 56, 58, 60 has a corresponding passband that is associated with a corresponding RF transmit communications band. In one embodiment of the RF TX/RX multiplexer 30, any or all of the second antenna, RF bandpass filters 50, 52, 54, 56, 58, 60 is omitted.

In one embodiment of the second antenna, first RF RX bandpass filter 50, the second antenna, first RF RX bandpass filter 50 receives and filters the second antenna, first RF receive signal R2A1 (FIG. 14) via the second RF antenna 36

(FIG. 14) and the second common connection node CN2 to provide the second antenna, first upstream RF receive signal R2U1. In one embodiment of the second antenna, second RF RX bandpass filter 52, the second antenna, second RF RX bandpass filter 52 receives and filters the second antenna, second RF receive signal R2A2 (FIG. 14) via the second RF antenna 36 (FIG. 14) and the second common connection node CN2 to provide the second antenna, second upstream RF receive signal R2U2. In one embodiment of the second antenna, $P^{TH}$ RF RX bandpass filter 54, the second antenna, $P^{TH}$ RF RX bandpass filter 54 receives and filters the second antenna, $P^{TH}$ RF receive signal R2AP (FIG. 14) via the second RF antenna 36 (FIG. 14) and the second common connection node CN2 to provide the second antenna, $P^{TH}$ upstream RF receive signal R2UP.

In one embodiment of the second antenna, first RF TX bandpass filter 56, the second antenna, first RF TX bandpass filter 56 receives and filters the second antenna, first downstream RF transmit signal T2D1 to provide the second antenna, first RF antenna transmit signal T2A1 (FIG. 14) via second common connection node CN2 and the second RF antenna 36 (FIG. 14). In one embodiment of the second antenna, second RF TX bandpass filter 58, the second antenna, second RF TX bandpass filter 58 receives and filters the second antenna, second downstream RF transmit signal T2D2 to provide the second antenna, second RF antenna transmit signal T2A2 (FIG. 14) via second common connection node CN2 and the second RF antenna 36 (FIG. 13). In one embodiment of the second antenna, $T^{TH}$ RF TX bandpass filter 60, the second antenna, $T^{TH}$ RF TX bandpass filter 60 receives and filters the second antenna, $T^{TH}$ downstream RF transmit signal T2DT to provide the second antenna, $T^{TH}$ RF antenna transmit signal T2AT (FIG. 14) via second common connection node CN2 and the second RF antenna 36 (FIG. 14).

Figure 17A:
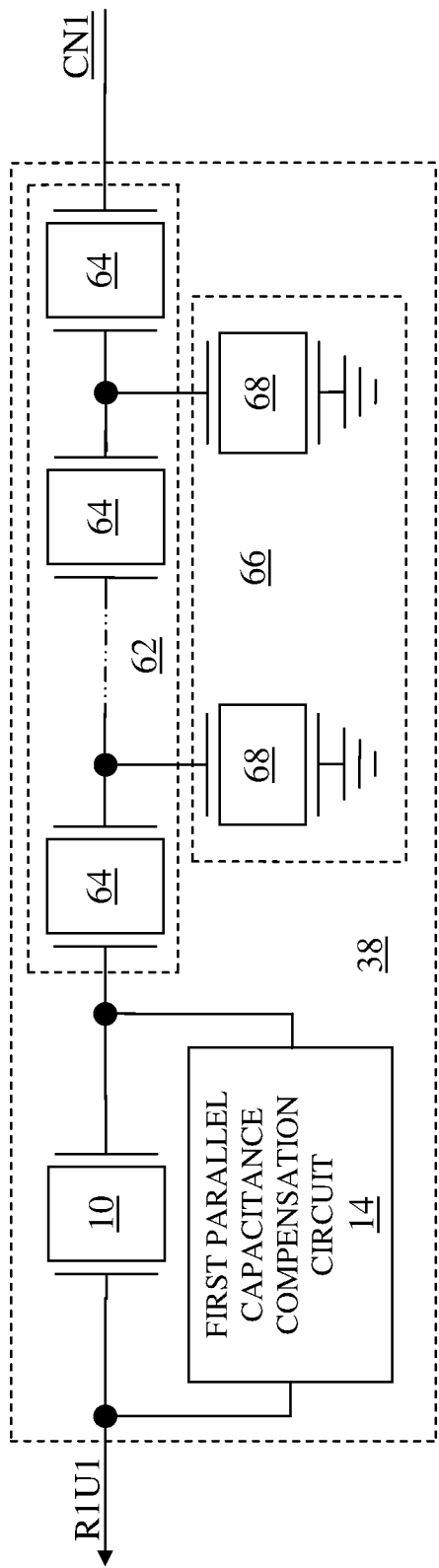
FIG. 17A shows details of the first antenna, first RF RX bandpass filter illustrated in FIG. 15 according to one embodiment of the first antenna, first RF RX bandpass filter.

FIG. 17A shows details of the first antenna, first RF RX bandpass filter 38 illustrated in FIG. 15 according to one embodiment of the first antenna, first RF RX bandpass filter 38. The first antenna, first RF RX bandpass filter 38 includes the first ARFR 10, the first parallel capacitance compensation circuit 14, a first group 62 of series-coupled ARFRs 64, and a first group 66 of shunt-coupled ARFRs 68. The first parallel capacitance compensation circuit 14 is coupled across the first ARFR 10.

The series-coupled ARFRs 64 of the first group 62 of series-coupled ARFRs 64 are coupled in series between the first ARFR 10 and the first RF antenna 28 (FIG. 13) via the first common connection node CN1. In one embodiment of the first group 66 of shunt-coupled ARFRs 68, each shunt-coupled ARFR 68 of the first group 66 of shunt-coupled ARFRs 68 is coupled between a corresponding pair of the first group 62 of series-coupled ARFRs 64 and ground. The first antenna, first RF RX bandpass filter 38 receives and filters the first antenna, first RF receive signal R1A1 (FIG. 15) via the first RF antenna 28 (FIG. 13) and the first common connection node CN1 to provide the first antenna, first upstream RF receive signal R1U1 via the first ARFR 10.

In one embodiment of the first parallel capacitance compensation circuit 14, the first parallel capacitance compensation circuit 14 is the first parallel capacitance compensation circuit 14 illustrated in FIG. 3, such that the first parallel capacitance compensation circuit 14 includes the first compensating ARFR 16 (FIG. 3), the second compensating ARFR 18 (FIG. 3), the first inductive element L1 (FIG. 3), and the second inductive element L2 (FIG. 3).

In an alternate embodiment of the first parallel capacitance compensation circuit 14, the first parallel capacitance compensation circuit 14 is the first parallel capacitance compensation circuit 14 illustrated in FIG. 4, such that the first parallel capacitance compensation circuit 14 includes the first compensating ARFR 16 (FIG. 4), the first inductive element L1 (FIG. 4), the second inductive element L2 (FIG. 4), and the capacitance circuit 20 (FIG. 4).

In an additional embodiment of the first parallel capacitance compensation circuit 14, the first parallel capacitance compensation circuit 14 is the first parallel capacitance compensation circuit 14 illustrated in FIG. 9, such that the first parallel capacitance compensation circuit 14 includes the first compensating ARFR 16 (FIG. 9), the first inductive element L1 (FIG. 9), and the second inductive element L2 (FIG. 9).

In another embodiment of the first parallel capacitance compensation circuit 14, the first parallel capacitance compensation circuit 14 is the first parallel capacitance compensation circuit 14 illustrated in FIG. 10, such that the first parallel capacitance compensation circuit 14 includes the first compensating ARFR 16 (FIG. 10), the first inductive element L1 (FIG. 10), and the second inductive element L2 (FIG. 10).

Figure 17B:
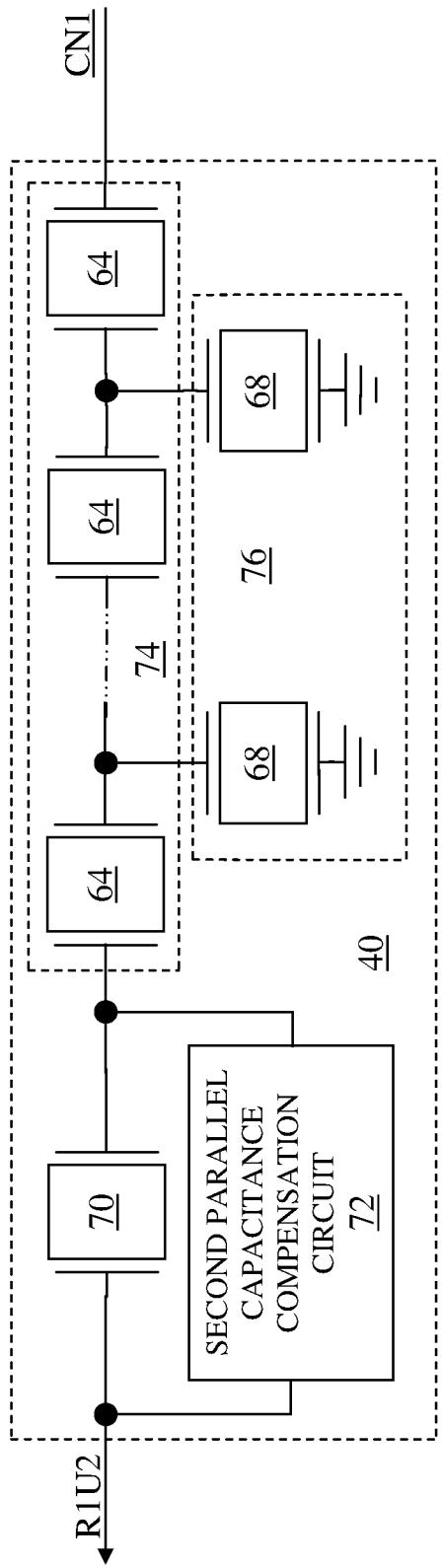
FIG. 17B shows details of the first antenna, second RF RX bandpass filter illustrated in FIG. 15 according to one embodiment of the first antenna, second RF RX bandpass filter.

FIG. 17B shows details of the first antenna, second RF RX bandpass filter 40 illustrated in FIG. 15 according to one embodiment of the first antenna, second RF RX bandpass filter 40. The first antenna, second RF RX bandpass filter 40 includes a second ARFR 70, a second parallel capacitance compensation circuit 72, a second group 74 of series-coupled ARFRs 64, and a second group 76 of shunt-coupled ARFRs 68. The first parallel capacitance compensation circuit 72 is coupled across the second ARFR 70. In one embodiment of the second ARFR 70, the second ARFR 70 is similar to the first ARFR 10 illustrated in FIG. 17A. In one embodiment of the second parallel capacitance compensation circuit 72, the second parallel capacitance compensation circuit 72 is similar to the first parallel capacitance compensation circuit 14 illustrated in FIG. 17A.

The series-coupled ARFRs 64 of the second group 74 of series-coupled ARFRs 64 are coupled in series between the second ARFR 70 and the first RF antenna 28 (FIG. 13) via the first common connection node CN1. In one embodiment of the second group 76 of shunt-coupled ARFRs 68, each shunt-coupled ARFR 68 of the second group 76 of shunt-coupled ARFRs 68 is coupled between a corresponding pair of the second group 74 of series-coupled ARFRs 64 and ground. The first antenna, second RF RX bandpass filter 40 receives and filters the first antenna, second RF receive signal R1A2 (FIG. 15) via the first RF antenna 28 (FIG. 13) and the first common connection node CN1 to provide the first antenna, second upstream RF receive signal R1U2 via the first ARFR 10.

In one embodiment of the second parallel capacitance compensation circuit 72, the second parallel capacitance compensation circuit 72 is similar to the first parallel capacitance compensation circuit 14 illustrated in FIG. 3. In an alternate embodiment of the second parallel capacitance compensation circuit 72, the second parallel capacitance compensation circuit 72 is similar to the first parallel capacitance compensation circuit 14 illustrated in FIG. 4. In an additional embodiment of the second parallel capacitance compensation circuit 72, the second parallel capacitance compensation circuit 72 is similar to the first parallel capacitance compensation circuit 14 illustrated in FIG. 9. In another embodiment of the second parallel capacitance compensation circuit 72, the first parallel capacitance compensation circuit 14 is similar to the first parallel capacitance compensation circuit 14 illustrated in FIG. 10.

FIG. 18A shows details of the first antenna, first RF RX bandpass filter 38 illustrated in FIG. 15 according to one embodiment of the first antenna, first RF RX bandpass filter 38. The first antenna, first RF RX bandpass filter 38 illustrated in FIG. 18A is similar to the first antenna, first RF RX bandpass filter 38 illustrated in FIG. 17A.

FIG. 18B shows details of the first antenna, first RF TX bandpass filter 44 illustrated in FIG. 15 according to one embodiment of the first antenna, first RF TX bandpass filter 44. The first antenna, first RF TX bandpass filter 44 includes the second ARFR 70, the second parallel capacitance compensation circuit 72, the second group 74 of series-coupled ARFRs 64, and the second group 76 of shunt-coupled ARFRs 68. The second parallel capacitance compensation circuit 72 is coupled across the second ARFR 70. In one embodiment of the second ARFR 70, the second ARFR 70 is similar to the first ARFR 10 illustrated in FIG. 18A. In one embodiment of the second parallel capacitance compensation circuit 72, the second parallel capacitance compensation circuit 72 is similar to the first parallel capacitance compensation circuit 14 illustrated in FIG. 18A.

The series-coupled ARFRs 64 of the second group 74 of series-coupled ARFRs 64 are coupled in series between the second ARFR 70 and the first RF antenna 28 (FIG. 13) via the first common connection node CN1. In one embodiment of the second group 76 of shunt-coupled ARFRs 68, each shunt-coupled ARFR 68 of the second group 76 of shunt-coupled ARFRs 68 is coupled between a corresponding pair of the second group 74 of series-coupled ARFRs 64 and ground.

The first antenna, first RF TX bandpass filter 44 receives and filters the first antenna, first downstream RF transmit signal T1D1 via the second ARFR 70 to provide the first antenna, first RF antenna transmit signal T1A1 (FIG. 13) via the first common connection node CN1 and the first RF antenna 28 (FIG. 13).

In one embodiment of the second parallel capacitance compensation circuit 72, the second parallel capacitance compensation circuit 72 is similar to the first parallel capacitance compensation circuit 14 illustrated in FIG. 3. In an alternate embodiment of the second parallel capacitance compensation circuit 72, the second parallel capacitance compensation circuit 72 is similar to the first parallel capacitance compensation circuit 14 illustrated in FIG. 4. In an additional embodiment of the second parallel capacitance compensation circuit 72, the second parallel capacitance compensation circuit 72 is similar to the first parallel capacitance compensation circuit 14 illustrated in FIG. 9. In another embodiment of the second parallel capacitance compensation circuit 72, the first parallel capacitance compensation circuit 14 is similar to the first parallel capacitance compensation circuit 14 illustrated in FIG. 10.

Figure 19A:
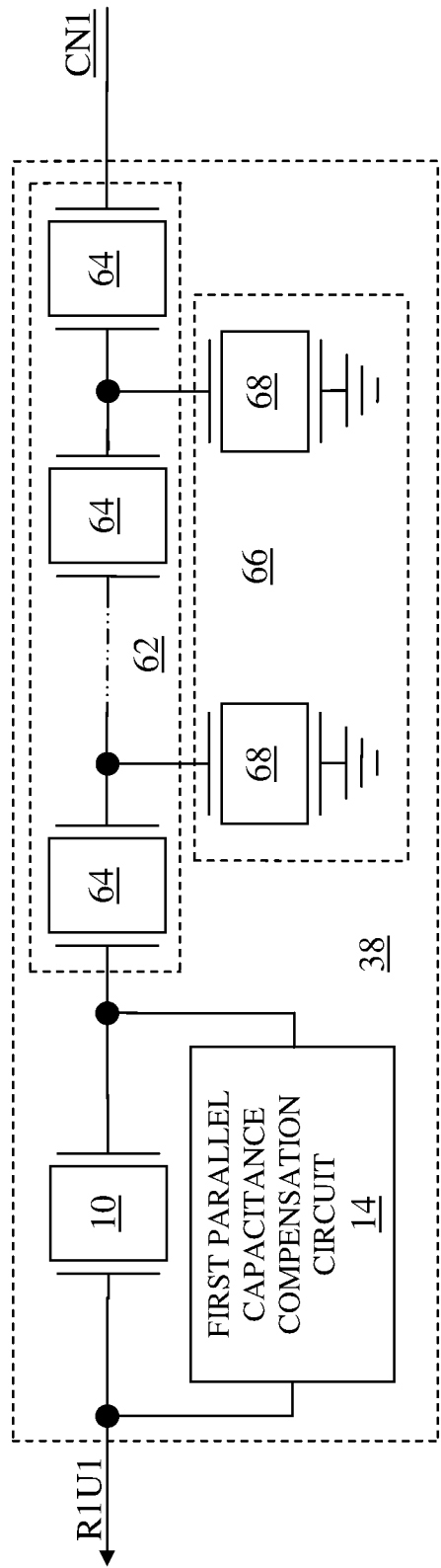
FIG. 19A shows details of the first antenna, first RF RX bandpass filter illustrated in FIG. 15 according to one embodiment of the first antenna, first RF RX bandpass filter.

FIG. 19A shows details of the first antenna, first RF RX bandpass filter 38 illustrated in FIG. 15 according to one embodiment of the first antenna, first RF RX bandpass filter 38. The first antenna, first RF RX bandpass filter 38 illustrated in FIG. 19A is similar to the first antenna, first RF RX bandpass filter 38 illustrated in FIG. 17A.

Figure 19B:
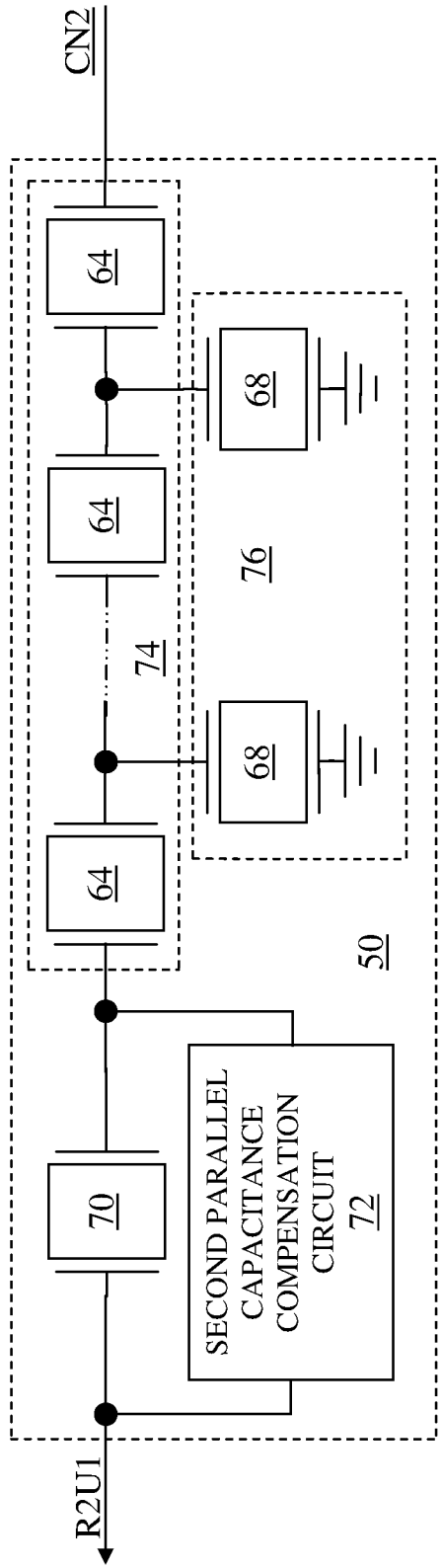
FIG. 19B shows details of the second antenna, first RF RX bandpass filter illustrated in FIG. 16 according to one embodiment of the second antenna, first RF RX bandpass filter.

FIG. 19B shows details of the second antenna, first RF RX bandpass filter 50 illustrated in FIG. 16 according to one embodiment of the second antenna, first RF RX bandpass filter 50. The second antenna, first RF RX bandpass filter 50 includes the second ARFR 70, the second parallel capacitance compensation circuit 72, the second group 74 of series-coupled ARFRs 64, and the second group 76 of shunt-coupled ARFRs 68. The second parallel capacitance compensation circuit 72 is coupled across the second ARFR 70. In one embodiment of the second ARFR 70, the second ARFR 70 is similar to the first ARFR 10 illustrated in FIG. 19A.

The series-coupled ARFRs 64 of the second group 74 of series-coupled ARFRs 64 are coupled in series between the second ARFR 70 and the second RF antenna 36 (FIG. 14) via the second common connection node CN2. In one embodiment of the second group 76 of shunt-coupled ARFRs 68, each shunt-coupled ARFR 68 of the second group 76 of shunt-coupled ARFRs 68 is coupled between a corresponding pair of the second group 74 of series-coupled ARFRs 64 and ground.

The second antenna, first RF RX bandpass filter 50 receives and filters the second antenna, first RF antenna receive signal R2A1 via the second RF antenna 36 (FIG. 14) and the second common connection node CN2 to provide the second antenna, first upstream RF receive signal R2U1.

In one embodiment of the second parallel capacitance compensation circuit 72, the second parallel capacitance compensation circuit 72 is similar to the first parallel capacitance compensation circuit 14 illustrated in FIG. 3. In an alternate embodiment of the second parallel capacitance compensation circuit 72, the second parallel capacitance compensation circuit 72 is similar to the first parallel capacitance compensation circuit 14 illustrated in FIG. 4. In an additional embodiment of the second parallel capacitance compensation circuit 72, the second parallel capacitance compensation circuit 72 is similar to the first parallel capacitance compensation circuit 14 illustrated in FIG. 9. In another embodiment of the second parallel capacitance compensation circuit 72, the first parallel capacitance compensation circuit 14 is similar to the first parallel capacitance compensation circuit 14 illustrated in FIG. 10.

In one embodiment of the second parallel capacitance compensation circuit 72, the second parallel capacitance compensation circuit 72 is similar to the first parallel capacitance compensation circuit 14 illustrated in FIG. 3. In an alternate embodiment of the second parallel capacitance compensation circuit 72, the second parallel capacitance compensation circuit 72 is similar to the first parallel capacitance compensation circuit 14 illustrated in FIG. 4. In an additional embodiment of the second parallel capacitance compensation circuit 72, the second parallel capacitance compensation circuit 72 is similar to the first parallel capacitance compensation circuit 14 illustrated in FIG. 9. In another embodiment of the second parallel capacitance compensation circuit 72, the first parallel capacitance compensation circuit 14 is similar to the first parallel capacitance compensation circuit 14 illustrated in FIG. 10.

FIG. 20A shows details of the first antenna, first RF TX bandpass filter 44 illustrated in FIG. 15 according to one embodiment of the first antenna, first RF TX bandpass filter 44. The first antenna, first RF TX bandpass filter 44 illustrated in FIG. 20A is similar to the first antenna, first RF RX bandpass filter 38 illustrated in FIG. 19A. However, the first antenna, first RF TX bandpass filter 44 receives and filters the first antenna, first downstream RF transmit signal T1D1 via the first ARFR 10 to provide the first antenna, first RF antenna transmit signal T1A1 (FIG. 13) via the first common connection node CN1 and the first RF antenna 28 (FIG. 13).

FIG. 20B shows details of the first antenna, second RF TX bandpass filter 46 illustrated in FIG. 15 according to one embodiment of the first antenna, second RF TX bandpass filter 46. The first antenna, second RF TX bandpass filter 46 includes the second ARFR 70, the second parallel capacitance compensation circuit 72, the second group 74 of series-coupled ARFRs 64, and the second group 76 of shunt-coupled ARFRs 68. The second parallel capacitance compensation circuit 72 is coupled across the second ARFR 70. In one embodiment of the second ARFR 70, the second ARFR 70 is similar to the first ARFR 10 illustrated in FIG. 18A. In one embodiment of the second parallel capacitance compensation circuit 72, the second parallel capacitance compensation circuit 72 is similar to the first parallel capacitance compensation circuit 14 illustrated in FIG. 18A.

The series-coupled ARFRs 64 of the second group 74 of series-coupled ARFRs 64 are coupled in series between the second ARFR 70 and the first RF antenna 28 (FIG. 13) via the first common connection node CN1. In one embodiment of the second group 76 of shunt-coupled ARFRs 68, each shunt-coupled ARFR 68 of the second group 76 of shunt-coupled ARFRs 68 is coupled between a corresponding pair of the second group 74 of series-coupled ARFRs 64 and ground.

The first antenna, second RF TX bandpass filter 46 receives and filters the first antenna, second downstream RF transmit signal T1D2 via the second ARFR 70 to provide the first antenna, second RF antenna transmit signal T1A2 (FIG. 13) via the first common connection node CN1 and the first RF antenna (FIG. 13).

In one embodiment of the second parallel capacitance compensation circuit 72, the second parallel capacitance compensation circuit 72 is similar to the first parallel capacitance compensation circuit 14 illustrated in FIG. 3. In an alternate embodiment of the second parallel capacitance compensation circuit 72, the second parallel capacitance compensation circuit 72 is similar to the first parallel capacitance compensation circuit 14 illustrated in FIG. 4. In an additional embodiment of the second parallel capacitance compensation circuit 72, the second parallel capacitance compensation circuit 72 is similar to the first parallel capacitance compensation circuit 14 illustrated in FIG. 9. In another embodiment of the second parallel capacitance compensation circuit 72, the second parallel capacitance compensation circuit 72 is similar to the first parallel capacitance compensation circuit 14 illustrated in FIG. 10.

FIG. 21A shows a portion of the RF circuitry 12 according to one embodiment of the RF circuitry 12. The RF circuitry 12 includes an acoustic substrate 78, which includes portions of the first antenna, first RF RX bandpass filter 38 illustrated in FIG. 17A. The acoustic substrate 78 includes the first ARFR 10, the first compensating ARFR 16, the second compensating ARFR 18, the first group 62 of series-coupled ARFRs 64, and the first group 66 of shunt-coupled ARFRs 68.

FIG. 21B shows a portion of the RF circuitry 12 according to one embodiment of the RF circuitry 12. The RF circuitry 12 includes the acoustic substrate 78. The acoustic substrate 78 illustrated in FIG. 21B is similar to the acoustic substrate 78 Illustrated in FIG. 21A, except in the acoustic substrate 78 illustrated in FIG. 21B, the second compensating ARFR 18 is omitted.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) circuitry, comprising:
a first RF antenna;
RF receive (RX) circuitry;
RF transmit (TX) circuitry; and
an RF TX/RX multiplexer coupled between the first RF antenna and the RF RX circuitry, and coupled between the first RF antenna and the RF TX circuitry, comprising:
a first RF RX bandpass filter configured to receive and filter a first RF RX signal and comprising:
a first acoustic RF resonator (ARFR); and
a first parallel capacitance compensation circuit comprising:
a first inductive element coupled to a first end of the first ARFR;
a second inductive element coupled to a second end of the first ARFR and negatively coupled to the first inductive element; and
a first compensating ARFR coupled to the first inductive element;
wherein the first parallel capacitance compensation circuit is configured to at least partially compensate for a parallel capacitance of the first ARFR and thereby improve out of band rejection of the first RF RX bandpass filter; and
a first RF TX bandpass filter configured to receive and filter a first RF TX signal.

2. The RF circuitry of claim 1, wherein the first RF TX bandpass filter comprises:
a second ARFR; and
a second parallel capacitance compensation circuit coupled across the second ARFR and configured to at least partially compensate for a parallel capacitance of the second ARFR and thereby improve out of band rejection of the first RF TX bandpass filter.

3. The RF circuitry of claim 2, wherein the second parallel capacitance compensation circuit comprises:
a third inductive element coupled to a first end of the second ARFR;
a fourth inductive element coupled to a second end of the second ARFR and negatively coupled to the third inductive element; and
a second compensating ARFR coupled to the third inductive element.

4. The RF circuitry of claim 2, further comprising:
a first plurality of ARFRs coupled in series between the first ARFR and the first RF antenna; and
a second plurality of ARFRs coupled in series between the second ARFR and the first RF antenna.

5. The RF circuitry of claim 2, wherein:
the first RF RX bandpass filter is configured to receive and filter the first RF RX signal from the first RF antenna to provide a first antenna, first upstream RF RX signal; and
the first RF TX bandpass filter is configured to receive and filter the first RF TX signal from the RF TX circuitry to provide a first antenna, first RF TX signal to the first RF antenna.

6. The RF circuitry of claim 5, wherein:
the RF RX circuitry is configured to receive and process the first antenna, first upstream RF RX signal; and
the RF TX circuitry processes and forwards the first RF TX signal to the RF TX/RX multiplexer.

7. The RF circuitry of claim 1, further comprising:
a second RF RX bandpass filter configured to receive and filter a second RF RX signal; and
a second RF TX bandpass filter configured to receive and filter a second RF TX signal.

8. The RF circuitry of claim 7, wherein the second RF RX bandpass filter comprises:
a second ARFR; and
a second parallel capacitance compensation circuit coupled across the second ARFR and configured to at least partially compensate for a parallel capacitance of the second ARFR and thereby improve out of band rejection of the second RF RX bandpass filter.

9. The RF circuitry of claim 8, wherein the second parallel capacitance compensation circuit comprises:
a third inductive element coupled to a first end of the second ARFR;
a fourth inductive element coupled to a second end of the second ARFR and negatively coupled to the third inductive element; and
a second compensating ARFR coupled to the third inductive element.

10. The RF circuitry of claim 8, further comprising:
a first plurality of ARFRs coupled in series between the first ARFR and the first RF antenna; and
a second plurality of ARFRs coupled in series between the second ARFR and a second RF antenna coupled to the RF TX/RX multiplexer.

11. The RF circuitry of claim 8, wherein:
the first RF RX bandpass filter is configured to receive and filter the first RF RX signal from the first RF antenna to provide a first antenna, first upstream RF RX signal; and
the second RF RX bandpass filter is configured to receive and filter the second RF RX signal from a second RF antenna to provide a second antenna, first upstream RF RX signal.

12. The RF circuitry of claim 11, wherein the RF RX circuitry is configured to simultaneously receive and process the first antenna, first upstream RF RX signal and the second antenna, first upstream RF RX signal.

13. The RF circuitry of claim 1, wherein the first compensating ARFR is coupled between the first inductive element and the first end of the first ARFR.

14. The RF circuitry of claim 13, further comprising a second compensating ARFR coupled between the second inductive element and the second end of the first ARFR.

15. The RF circuitry of claim 1, wherein the first compensating ARFR is coupled between the first inductive element and ground, and the first compensating ARFR is further coupled between the second inductive element and the ground.

16. The RF circuitry of claim 1, wherein an absolute value of a coefficient of coupling between the first inductive element and the second inductive element is greater than zero and less than 0.7.

17. The RF circuitry of claim 1, wherein an inductance of the first inductive element is not equal to an inductance of the second inductive element.

18. The RF circuitry of claim 1, wherein each of the first ARFR and the first compensating ARFR is a surface acoustic wave (SAW) RF resonator.

19. The RF circuitry of claim 1, wherein each of the first ARFR and the first compensating ARFR is a bulk acoustic wave (BAW) RF resonator.

20. The RF circuitry of claim 1, further comprising an acoustic substrate, which comprises the first ARFR and the first compensating ARFR.

* * * * *